(12) United States Patent
Yosui et al.

(10) Patent No.: US 10,116,025 B2
(45) Date of Patent: Oct. 30, 2018

(54) ELECTRONIC APPARATUS

(71) Applicant: Murata Manufacturing Co., Ltd., Nagaokakyo-shi, Kyoto-fu (JP)

(72) Inventors: Kuniaki Yosui, Nagaokakyo (JP); Takahiro Baba, Nagaokakyo (JP); Kosuke Nishino, Nagaokakyo (JP)

(73) Assignee: MURATA MANUFACTURING CO., LTD., Kyoyo (JP)

( * ) Notice: Subject to any disclaimer, the term of this patent is extended or adjusted under 35 U.S.C. 154(b) by 0 days.

(21) Appl. No.: 15/859,815

(22) Filed: Jan. 2, 2018

(65) Prior Publication Data

US 2018/0145384 A1 May 24, 2018

Related U.S. Application Data

(63) Continuation of application No. 15/256,818, filed on Sep. 6, 2016, now Pat. No. 9,899,715, which is a (Continued)

(30) Foreign Application Priority Data

Mar. 27, 2014 (JP) .................................. 2014-064985
Apr. 22, 2014 (JP) .................................. 2014-087890

(51) Int. Cl.
*H05K 7/00* (2006.01)
*H01P 1/203* (2006.01)
(Continued)

(52) U.S. Cl.
CPC ............ *H01P 1/203* (2013.01); *H01P 1/2039* (2013.01); *H01P 3/026* (2013.01); *H01P 3/08* (2013.01);
(Continued)

(58) Field of Classification Search
CPC .... H01P 5/02–5/04; H01P 5/028; H01P 3/802
(Continued)

(56) References Cited

U.S. PATENT DOCUMENTS

| 5,854,534 | A  | * | 12/1998 | Beilin ............... H01L 21/486 257/691 |
| 7,656,678 | B2 | * | 2/2010 | Partridge .......... H01L 23/49833 361/767 |
| 7,787,254 | B2 | * | 8/2010 | Clayton ............. H01L 23/473 361/749 |

OTHER PUBLICATIONS

Yosui et al., "Transmission Line Member and Electronic Apparatus", U.S. Appl. No. 15/256,818, filed Sep. 6, 2016.

* cited by examiner

*Primary Examiner* — Tuan T Dinh
(74) *Attorney, Agent, or Firm* — Keating & Bennett, LLP

(57) ABSTRACT

An electronic apparatus includes a transmission line member and a mount circuit board. The transmission line member includes a dielectric base body, a first signal conductor, a first ground conductor, a second ground conductor, and a first transmission line that transmits a first high frequency signal and is defined by the first signal conductor interposed between the first and second ground conductors. The mount circuit board is wrapped by the transmission line member such that the transmission line member covers the mount circuit board from a top surface to a back surface via a side surface of the mount circuit board. At least one of an IC chip, a mount component, and a battery pack is mounted on the mount circuit board and is wrapped by the transmission line member so as to be disposed on an inner peripheral side of the transmission line member.

3 Claims, 26 Drawing Sheets

Related U.S. Application Data continuation of application No. PCT/JP2015/055512, filed on Feb. 26, 2015.

(51) Int. Cl.
    *H01P 3/02*     (2006.01)
    *H01P 3/08*     (2006.01)
    *H01P 5/02*     (2006.01)
    *H05K 1/18*     (2006.01)
    *H05K 5/00*     (2006.01)
    *H05K 1/02*     (2006.01)
    *H05K 1/14*     (2006.01)

(52) U.S. Cl.
CPC ............... *H01P 5/02* (2013.01); *H05K 1/025* (2013.01); *H05K 1/0242* (2013.01); *H05K 1/18* (2013.01); *H05K 5/0086* (2013.01); *H05K 1/028* (2013.01); *H05K 1/0216* (2013.01); *H05K 1/0225* (2013.01); *H05K 1/147* (2013.01); *H05K 2201/053* (2013.01); *H05K 2201/056* (2013.01); *H05K 2201/0715* (2013.01); *H05K 2201/09254* (2013.01); *H05K 2201/09263* (2013.01); *H05K 2201/09727* (2013.01)

(58) Field of Classification Search
USPC ........ 361/760–763, 782–785, 792–795, 803; 333/33–35, 165–167; 174/250–260
See application file for complete search history.

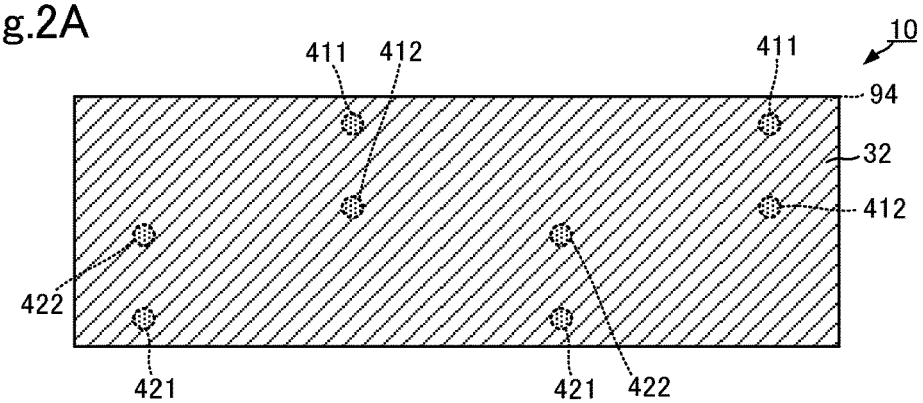
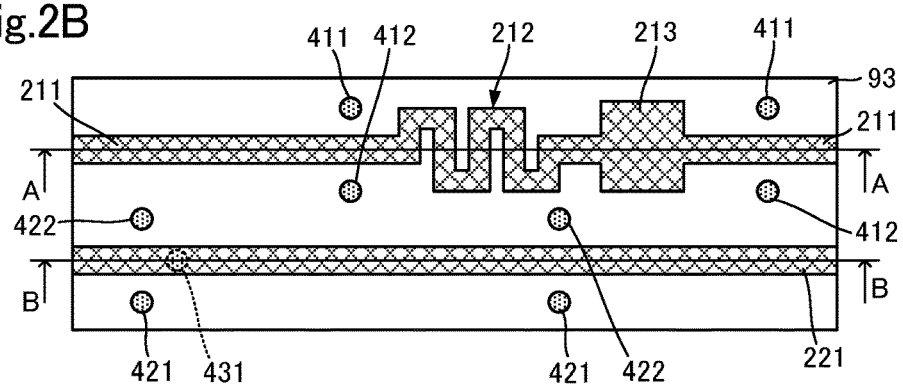
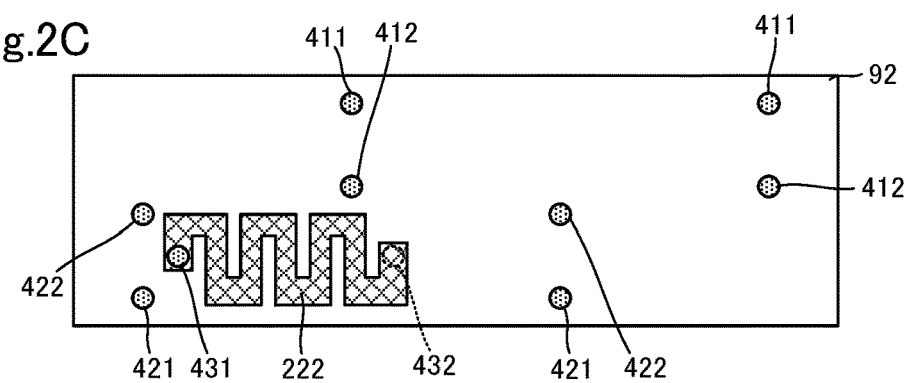
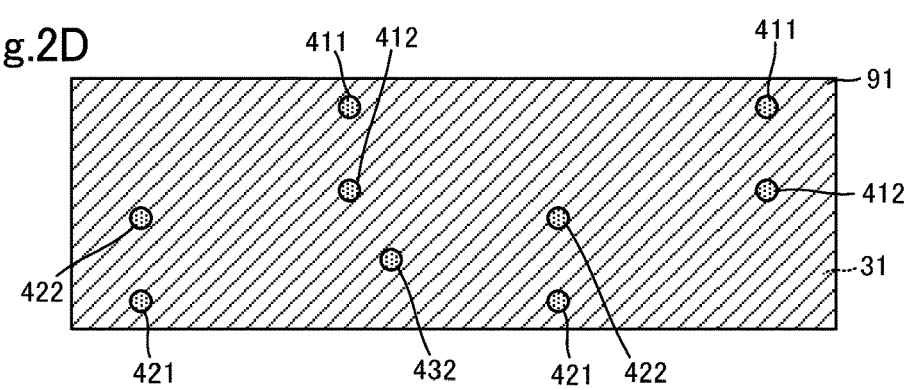

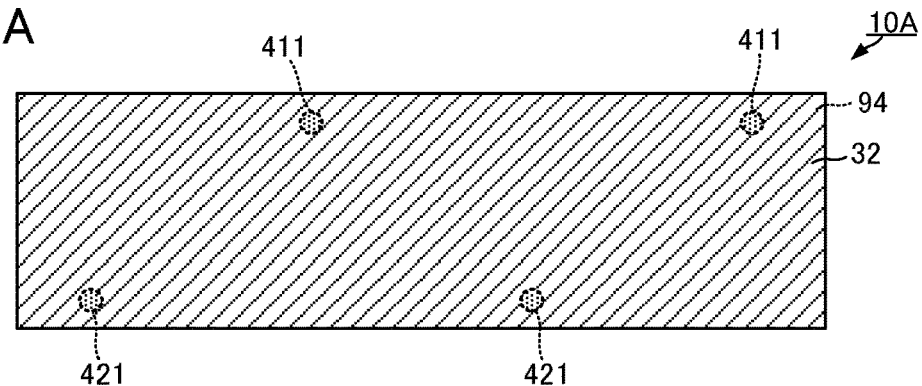
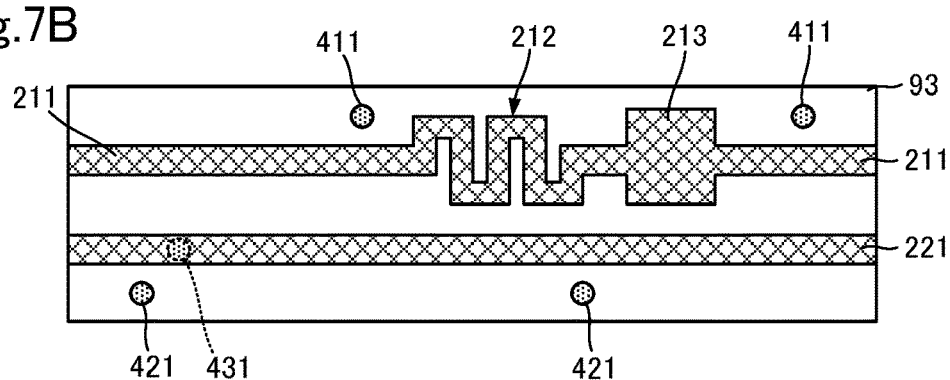
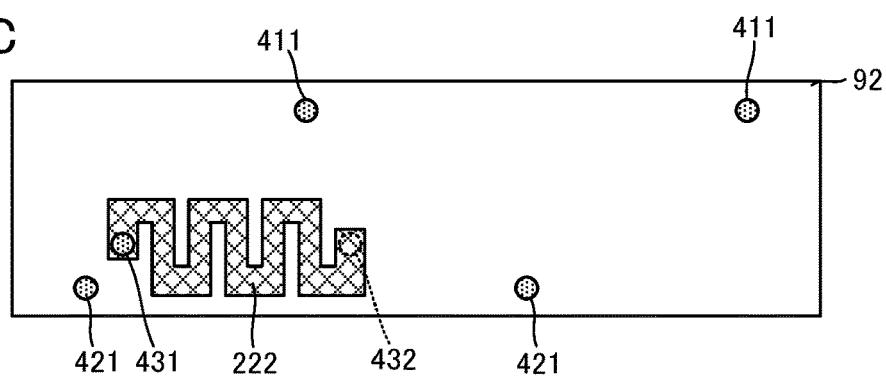
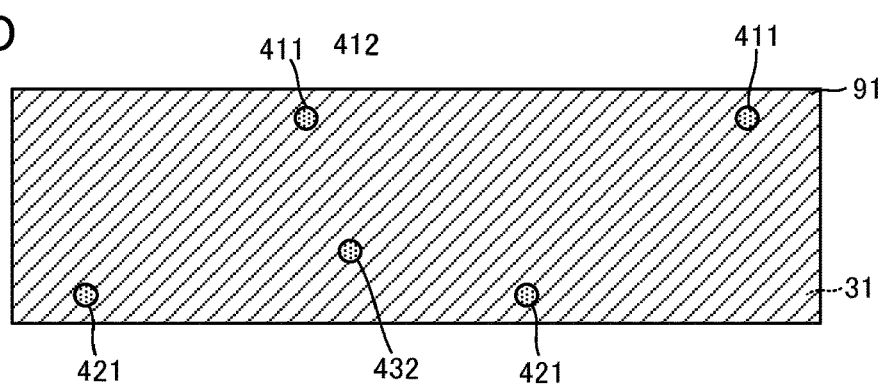

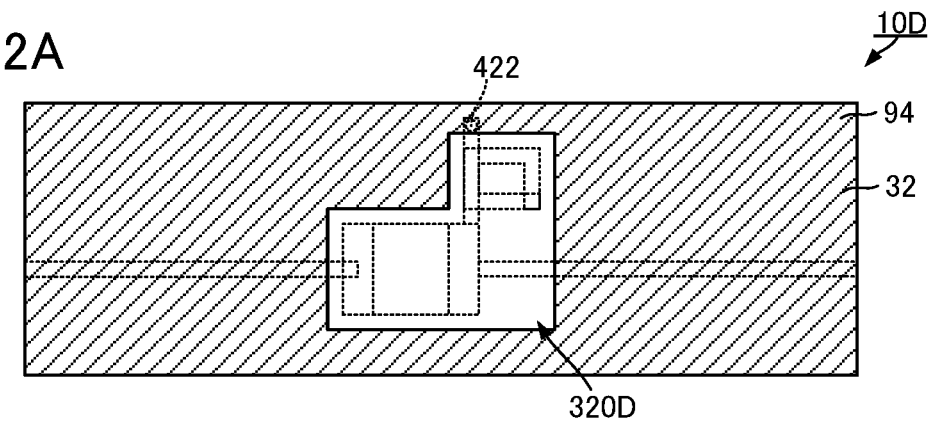
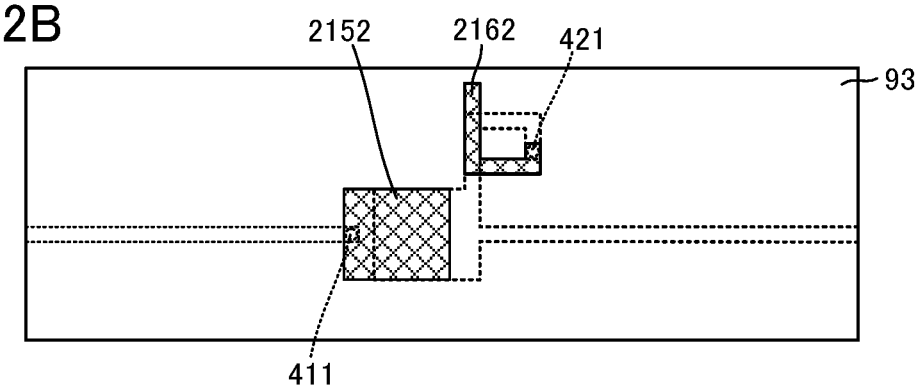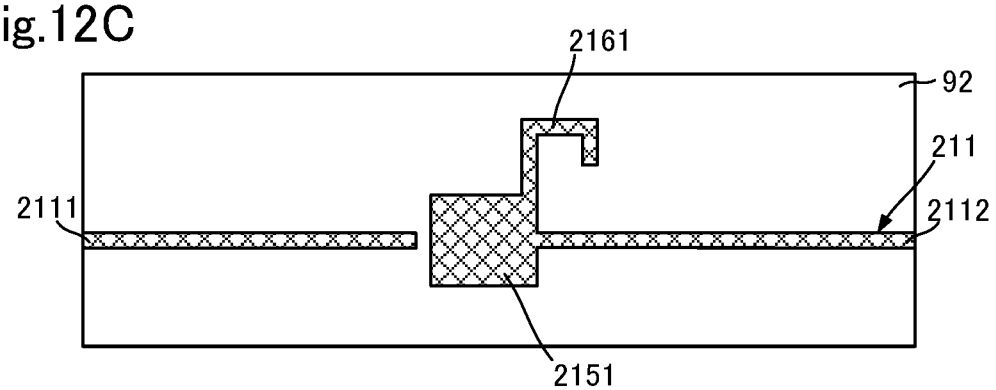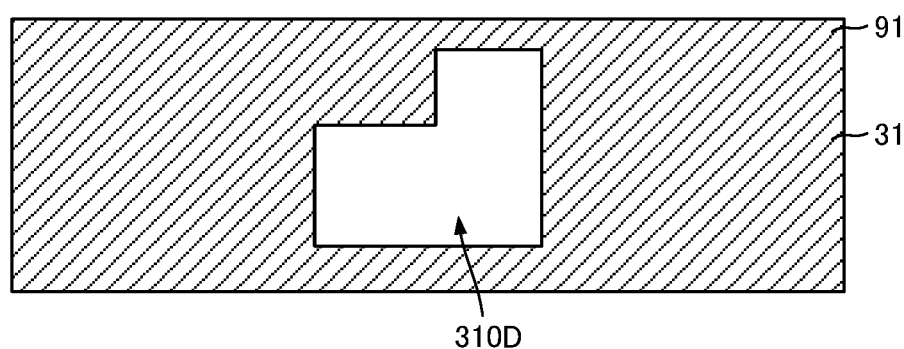

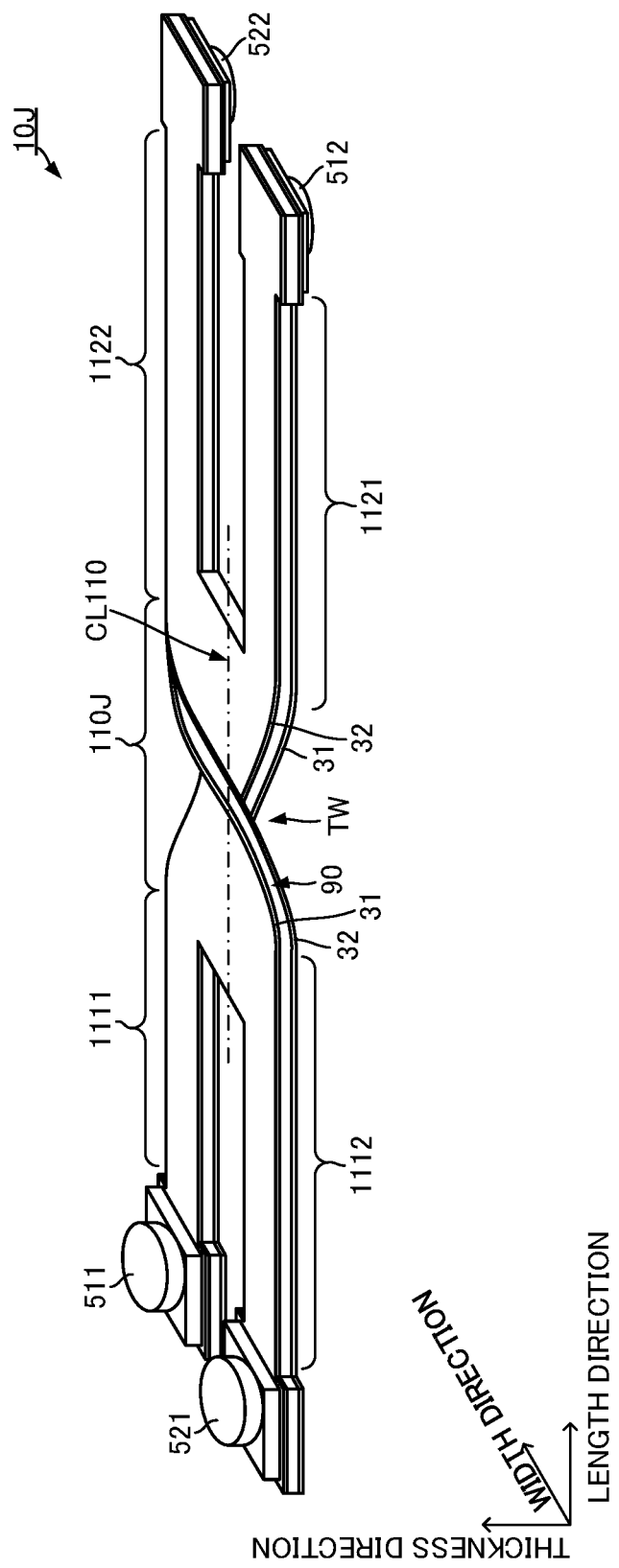

ELECTRONIC APPARATUS

CROSS REFERENCE TO RELATED APPLICATIONS

This application claims the benefit of priority to Japanese Patent Application 2014-064985 filed Mar. 27, 2014 and Japanese Patent Application 2014-087890 filed Apr. 22, 2014 and is a Continuation Application of PCT/JP2015/055512 filed on Feb. 26, 2015, and the entire contents of each of these applications are hereby incorporated herein by reference.

BACKGROUND OF THE INVENTION

1. Field of the Invention

The present invention relates to transmission line members in which signal conductors transmitting high frequency signals of different frequencies are closely disposed, and to electronic apparatuses incorporating such transmission line members.

2. Description of the Related Art

Different kinds of transmission line members are developed for transmitting high frequency signals. For example, a transmission line member described in the specification of Japanese Patent No. 4962660 has a stripline structure. The transmission line member described in Japanese Patent No. 4962660 includes an elongated dielectric base body, and an elongated signal conductor is disposed at an intermediate point in the thickness direction of this dielectric base body. Ground conductors are disposed on both end surfaces in the thickness direction of the dielectric base body.

This allows the realization of a transmission line having a stripline structure in which a signal conductor is interposed between two ground conductors.

In a case that a plurality of such transmission line members configured as above is disposed inside a communication apparatus, in which transmission line members are to be installed, it is preferred to have a wider distance between the transmission line members.

However, with downsizing of electronic apparatuses, in some case, a plurality of transmission line members needs to be disposed close to each other. In this case, sometimes there is an issue in that adjacent transmission lines are electromagnetically coupled (high-frequency-wise coupling). This causes leakage of a first high frequency signal traveling a first transmission line to a second transmission line, allowing a leaked signal to travel on the second transmission line. Conversely, sometimes there is an issue in that a second high frequency signal traveling along the second transmission line leaks to the first transmission line, allowing a leaked signal to travel on the first transmission line.

To downsize the transmission line member, it is conceivable to have an example in which a plurality of signal conductors is disposed close to each other in a single dielectric base body. However, even in such a structure, there is a similar issue in that a plurality of transmission lines is likely to couple to each other. In other words, in such a case, noise is superimposed on a target high frequency signal, and transmission characteristics of the transmission line at which the noise is superimposed is degraded

SUMMARY OF THE INVENTION

Preferred embodiments of the present invention provide a transmission line member that allows close disposition of a plurality of transmission lines without degrading their transmission characteristics, and provide an electronic apparatus including the transmission line member.

A transmission line member according to a preferred embodiment of the present invention includes a dielectric base body having a plate shape; a first signal conductor and a second signal conductor that are disposed inside the dielectric base body, have elongated shapes extending along a transmission direction of high frequency signal, and are arranged adjacent to each other; a first ground conductor disposed at one side of the first signal conductor and the second signal conductor in a thickness direction of the dielectric base body; and a second ground conductor disposed at another side of the first signal conductor and the second signal conductor in the thickness direction of the dielectric base body. A first transmission line that transmits a first high frequency signal is defined by the first signal conductor interposed between the first ground conductor and the second ground conductor. A second transmission line that transmits a second high frequency signal is defined by the second signal conductor interposed between the first ground conductor and the second ground conductor.

A transmission line member according to a preferred embodiment of the present invention further includes a first filter device or a second filter device. Alternatively, a transmission line member according to a preferred embodiment of the present invention includes the first filter device and the second filter device.

The first filter device is disposed in the first transmission line, is connected to the first signal conductor, and has a filter characteristic in which a pass band includes a fundamental frequency of the first high frequency signal and an attenuation band includes a frequency of the second high frequency signal. The second filter device is disposed in the second transmission line, is connected to the second signal conductor, and has a filter characteristic in which a pass band includes a fundamental frequency of the second high frequency signal and an attenuation band includes a frequency of the first high frequency signal.

According to the configuration described above, when the first high frequency signal and its harmonic signals leak from the first transmission line to the second transmission line, the second filter device attenuates the leaked signals. When the second high frequency signal and its harmonic signals leak from the second transmission line to the first transmission line, the first filter device attenuates the leaked signals. This significantly reduces or prevents degradation in transmission characteristics even in a case that a leak occurs at the first transmission line or the second transmission line. Specifically, the degradation of the transmission characteristics may be reliably reduced or prevented by providing the first transmission line with the first filter device and providing the second transmission line with the second filter device. Furthermore, leakage of high frequency signal to outside may be significantly reduced or prevented by having a configuration in which each of the signal conductors of the transmission lines is interposed between the first ground conductor and the second ground conductor.

Preferably, in a transmission line member according to a preferred embodiment of the present invention, a first conductor pattern connected to the first signal conductor defines at least a portion of the first filter device. Preferably, in a transmission line member according to a preferred embodiment of the present invention, a second conductor pattern connected to the second signal conductor defines at least a portion of the second filter device.

These configurations make it possible to reduce the thickness and the size of the transmission line member.

Preferably, in a transmission line member according to a preferred embodiment of the present invention, the second ground conductor includes an opening at a portion that overlaps the first signal conductor and the second signal conductor in planar view of the dielectric base body.

This configuration makes it possible to further reduce the thickness of the transmission line member.

Preferably, a transmission line member according to a preferred embodiment of the present invention is configured as follows. A first external connection terminal and a second external connection terminal are disposed at both end portions of the dielectric base body in the transmission direction of high frequency signal, the first external connection terminal being connected to the first signal conductor, the second external connection terminal being connected to the second signal conductor. Two of the first filter devices are included, and these two first filter devices are each arranged near the first external connection terminals at the both end portions. Two of the second filter devices are included, and these two second filter devices are each arranged near the second external connection terminals at the both end portions.

With these configurations, the leakage of high frequency signal to outside may be more reliably reduced or prevented.

Preferably, a transmission line member according to a preferred embodiment of the present invention is configured as follows. The dielectric base body has flexibility. The transmission line member includes a plurality of interlayer connection conductors that connects the first ground conductor and the second ground conductor and extends in the thickness direction. The plurality of interlayer connection conductors have a gap between the interlayer connection conductors along the transmission direction of high frequency signal. In planar view of the dielectric base body and in a direction perpendicular or substantially perpendicular to the transmission direction of high frequency signal, an arrangement density of the interlayer connection conductors disposed in an area of the dielectric base body located at an outer side of the first signal conductor and the second signal conductor is higher than an arrangement density of the interlayer connection conductors disposed in an area of the dielectric base body located between the first signal conductor and the second signal conductor.

This configuration makes it possible to significantly reduce or prevent leakage of a high frequency signal traveling along the first signal conductor or the second signal conductor to outside the transmission line member. Furthermore, in this configuration, the number of the interlayer connection conductors between the first signal conductor and the second signal conductor is less, thus improving the flexibility of the transmission line member.

More preferably, a transmission line member according to a preferred embodiment of the present invention is configured as follows. The dielectric base body has flexibility. The transmission line member includes a plurality of interlayer connection conductors that connects the first ground conductor and the second ground conductor and extends in the thickness direction. The plurality of interlayer connection conductors is, in planar view of the dielectric base body, arranged so as to have a gap between the interlayer connection conductors along the transmission direction of high frequency signal, and in a direction perpendicular or substantially perpendicular to the transmission direction of high frequency signal, disposed only at an area of the dielectric base body outside the first signal conductor and the second signal conductor.

This configuration makes it possible to significantly reduce or prevent leakage of a high frequency signal traveling along the first signal conductor or the second signal conductor to outside the transmission line member. Furthermore, in this configuration, no interlayer connection conductor is provided between the first signal conductor and the second signal conductor. This improves the flexibility of the transmission line member and reduces the width of the transmission line member.

In a transmission line member according to a preferred embodiment of the present invention, the dielectric base body may include a twist at a predetermined location along the transmission direction of high frequency signal.

This configuration makes the transmission line member compatible with more diverse ways of mounting.

In a transmission line member according to a preferred embodiment of the present invention, the twist may be provided at a location where the first signal conductor and the second signal conductor are arranged in parallel or substantially in parallel to each other.

This configuration facilitates the reversal of spatial relationship between the first signal conductor and the second signal conductor.

An electronic apparatus according to a preferred embodiment of the present invention includes any one of the foregoing transmission line members, a plurality of circuit elements connected by the transmission line member, and a housing that includes the plurality of circuit elements.

This configuration describes an electronic apparatus that includes the foregoing transmission line member. In a case that a plurality of kinds of high frequency signals travels between a plurality of circuit elements, the foregoing transmission line member enables the reduction of transmission loss.

Various preferred embodiments of the present invention significantly reduce or prevent degradation in transmission characteristics even in the case where a plurality of transmission lines is disposed close to each other.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A to 2D are exploded plan views depicting a structure of the transmission line member according to the first preferred embodiment of the present invention.

FIGS. 7A to 7D are exploded plan views depicting a structure of a transmission line member according to a second preferred embodiment of the present invention.

FIGS. 12A to 12D are exploded plan views depicting a structure of a transmission line member according to a fifth preferred embodiment of the present invention.

FIG. 22 is an external perspective view of another transmission line member having a twist according to a preferred embodiment of the present invention.

DETAILED DESCRIPTION OF THE PREFERRED EMBODIMENTS

Figure 1:
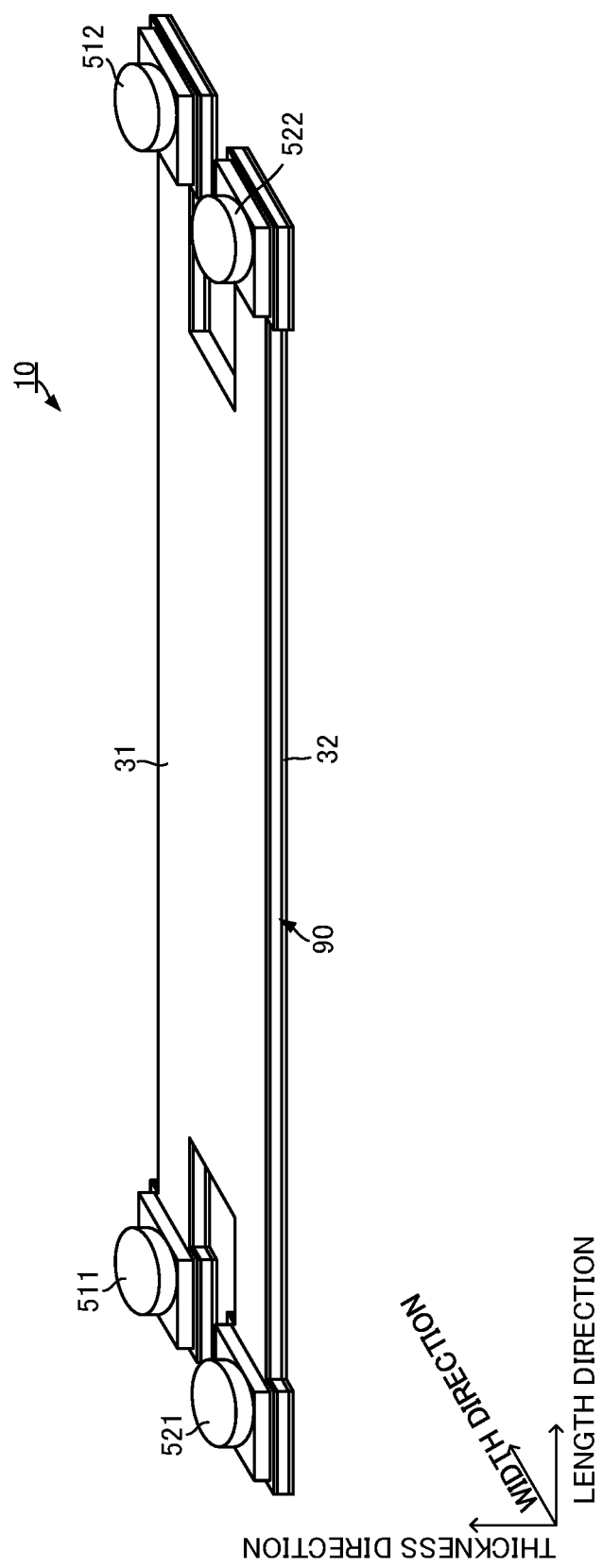
FIG. 1 is an external perspective view of a transmission line member according to a first preferred embodiment of the present invention.
Figure 3A:
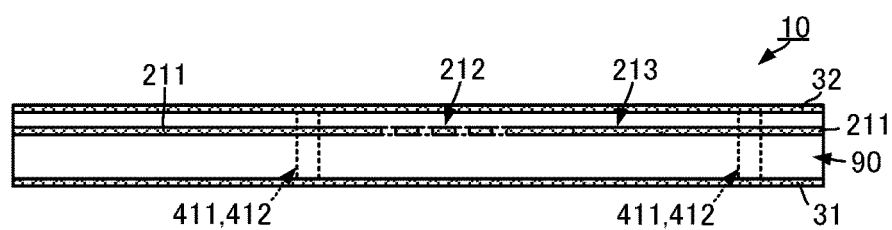
FIGS. 3A and 3B are cross sectional views depicting the structure of the transmission line member according to the first preferred embodiment of the present invention.
Figure 3B:
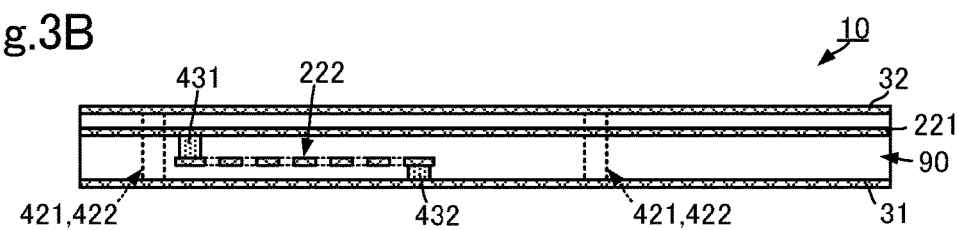
Figure 4:
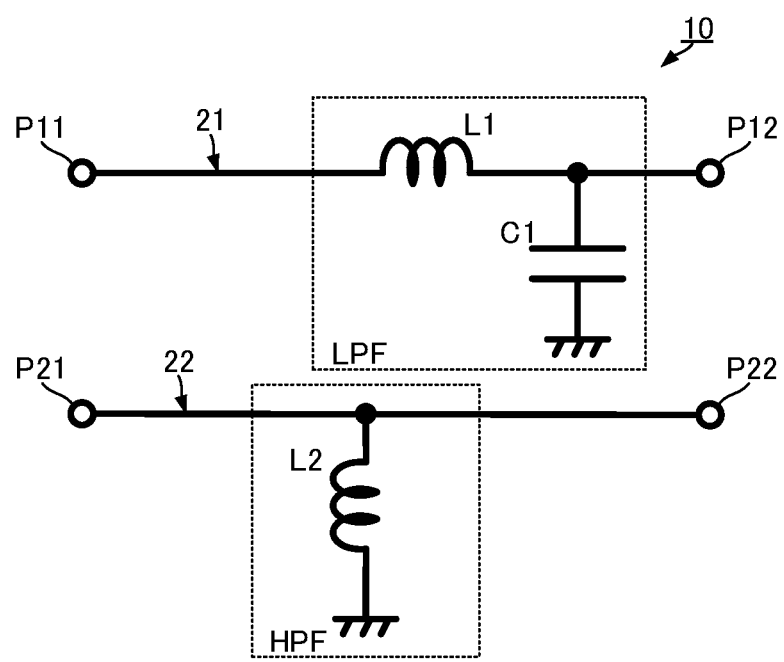
FIG. 4 is an equivalent circuit diagram of the transmission line member according to the first preferred embodiment of the present invention.
Figure 5:
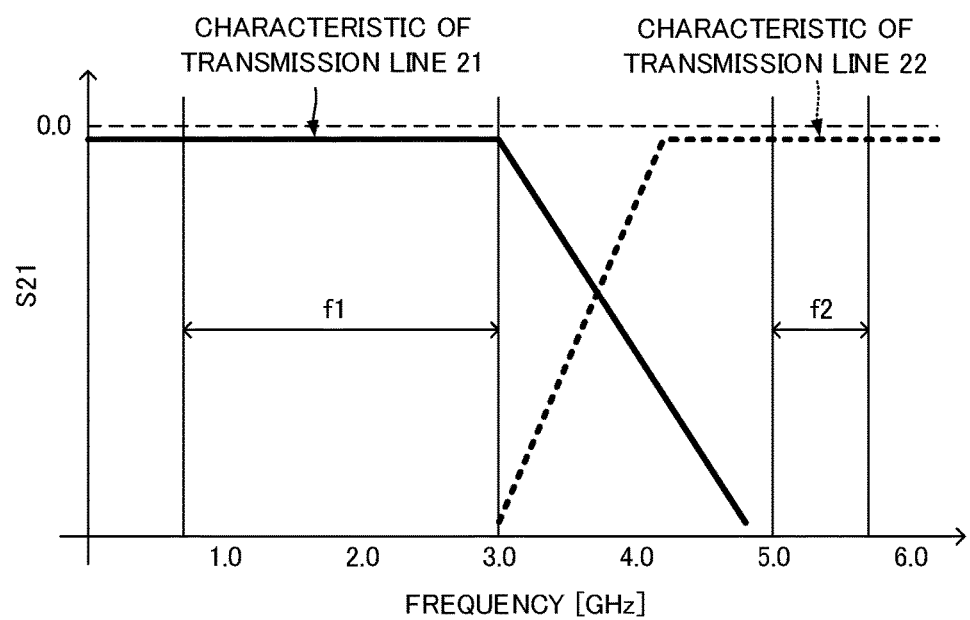
FIG. 5 is a diagram depicting a filter characteristic of the transmission line member according to the first preferred embodiment of the present invention.

A transmission line member according to a first preferred embodiment of the present invention is now described with reference to the drawings. FIG. 1 is an external perspective view of the transmission line member according to the first preferred embodiment of the present invention. FIGS. 2A to 2D are exploded plan views depicting a structure of the transmission line member according to the first preferred embodiment of the present invention. FIGS. 3A and 3B are cross sectional views depicting the structure of the transmission line member according to the first preferred embodiment of the present invention. FIG. 3A is a cross sectional view at line A-A of FIG. 2B, and FIG. 3B is a cross sectional view at line B-B of FIG. 2B. FIG. 4 is an equivalent circuit diagram of the transmission line member according to the first preferred embodiment of the present invention. FIG. 5 is a diagram depicting a filter characteristic of the transmission line member according to the first preferred embodiment of the present invention.

In the following description, FIG. 1 is described assuming that the side of a reference ground conductor on which connectors are provided is the upper surface, and FIG. 2A and the drawings that follow are described assuming that the side of auxiliary ground conductor on which no connector is provided is the upper surface.

As depicted in FIG. 1, a transmission line member 10 has an elongated plate shape. In the transmission line member 10, a length direction corresponds to a transmission direction of high frequency signal. In the transmission line member 10, a direction parallel or substantially parallel to a flat surface and perpendicular or substantially perpendicular to the length direction is a width direction.

The transmission line member 10 includes a main portion and extraction portions connected to both end portions of the main portion. The main portion has a structure such that a first transmission line and a second transmission line are integrated together whereas the extraction portion has a structure such that the first transmission line and the second transmission line are separated from each other. Details of the configuration will be described below. Note that, although the configuration including the main portion in which the first transmission line and the second transmission line preferably are integrated together is described below, the configurations of filter device and the like in the main portion of the present preferred embodiment are applicable even to configurations in which the first transmission line and the second transmission line are separated from each other, provided that the first transmission line and the second transmission line are disposed close to each other, as described in the foregoing Summary of the Invention section.

At one end portion P11 of the first transmission line, an external connection terminal 511 including a connector member is connected. At the other end portion P12 of the first transmission line, an external connection terminal 512 including a connector member is connected. The external connection terminals 511 and 512 correspond to "first external connection terminals".

At one end portion P21 of the second transmission line, an external connection terminal 521 including a connector member is connected. At the other end portion P22 of the second transmission line, an external connection terminal 522 including a connector member is connected. The external connection terminals 521 and 522 correspond to "second external connection terminals".

As depicted in FIG. 2A to FIG. 3B, the transmission line member 10 includes a dielectric base body 90 having a plate shape, a reference ground conductor 31, and an auxiliary ground conductor 32. The dielectric base body 90 is preferably formed by stacking dielectric layers 91, 92, 93, and 94. The dielectric base body 90 is including, for example, a flexible material such as, but not limited to, liquid crystal polymer or polyimide.

The reference ground conductor 31 is arranged so as to cover substantially the entire area of a surface on the side of one end portion in the thickness direction of the dielectric base body 90. The auxiliary ground conductor 32 is arranged so as to cover substantially the entire area of a surface at the other end portion side of the dielectric base body 90 in the thickness direction. The reference ground conductor 31 and the auxiliary ground conductor 32 include a material having high electrical conductivity such as, but not limited to, copper (Cu). The reference ground conductor 31 corresponds to a "first ground conductor", and the auxiliary ground conductor 32 corresponds to a "second ground conductor".

The reference ground conductor 31 is a ground conductor that mainly determines characteristic impedances of the first transmission line that utilizes a first signal conductor 211 and the second transmission line that utilizes a second signal conductor 221. For example, the reference ground conductor 31 is designed in such a way that the characteristic impedance of the first transmission line is equal to about 55Ω, a little higher than about 50Ω, by using the first signal conductor 211 and the reference ground conductor 31. Similarly, the reference ground conductor 31 is designed in such a way that the characteristic impedance of the second transmission line is equal to about 55Ω, a little higher than about 50Ω, by using the second signal conductor 221 and the reference ground conductor 31. Next, the shape of the auxiliary ground conductor 32 is adjusted in such a way that the characteristic impedance of the first transmission line is equal to about 50Ω by using the first signal conductor 211, the reference ground conductor 31, and the auxiliary ground conductor 32. Similarly, the shape of the auxiliary ground conductor 32 is adjusted in such a way that the characteristic impedance of the second transmission line is equal to about 50Ω by using the second signal conductor 221, the reference ground conductor 31, and the auxiliary ground conductor 32.

At an intermediate point in the thickness direction of the dielectric base body 90, the first signal conductor 211 and the second signal conductor 221 are disposed. The first signal conductor 211 and the second signal conductor 221 each have an elongated conductor pattern extending along the length direction of the dielectric base body 90 (transmission direction of high frequency signal). The first signal conductor 211 and the second signal conductor 221 each include a material having high electrical conductivity such as, but not limited to, copper (Cu).

The first signal conductor 211 and the second signal conductor 221 have a gap between them in the width direction of the dielectric base body 90. The first signal conductor 211 and the second signal conductor 221 extend parallel or substantially parallel along substantially the entire lengths thereof.

Such a structure enables the realization of a structure in which the first signal conductor 211 is interposed between the reference ground conductor 31 and the auxiliary ground conductor 32 in the thickness direction of the dielectric base body 90, and this structure defines a first transmission line 21 depicted in FIG. 4. Furthermore, the foregoing configuration enables the realization of a structure in which the second signal conductor 221 is interposed between the reference ground conductor 31 and the auxiliary ground conductor 32 in the thickness direction of the dielectric base body 90, and this structure provides a second transmission line 22 depicted in FIG. 4. In this way, the transmission line member 10 of the present preferred embodiment provides two transmission lines (first transmission line and second transmission line) using the single dielectric base body 90. This makes downsizing easier, compared with the case where the first transmission line and the second transmission line are formed separately. Furthermore, this enables the stable retention of the gap between the first transmission line and the second transmission line without being affected by a manner of installing to an electronic apparatus, thus significantly reducing or preventing a characteristic change due to leaking of high frequency signals from their respective transmission lines.

Furthermore, the flexibility of the transmission line member 10 is improved and the connection with the external connection terminal is facilitated by adopting the structure that separates the transmission line 21 and the transmission line 22 in the vicinity of the external connection terminals 511, 512, 521, and 522 as described above. Furthermore, the transmission line 21 and the transmission line 22 are structurally joined together at a location far from the external connection terminals 511, 512, 521, and 522 and define a single structure including the two transmission lines. This improves ease of handling.

Furthermore, the transmission line member 10 includes a plurality of interlayer connection conductors 411, 412, 421, and 422 extending in the thickness direction of the dielectric base body 90. The plurality of interlayer connection conductors 411, 412, 421, and 422 is each connected to the reference ground conductor 31 and the auxiliary ground conductor 32.

A plurality of the interlayer connection conductors 411 have a gap between them along the length direction of the dielectric base body 90. The plurality of the interlayer connection conductors 411 is arranged, in planar view of the dielectric base body 90, between a side surface of the dielectric base body 90 on the first signal conductor 211 side in the width direction and the first signal conductor 211.

A plurality of the interlayer connection conductors 412 have a gap between them along the length direction of the dielectric base body 90. The plurality of the interlayer connection conductors 412 is arranged, in planar view of the dielectric base body 90, between the first signal conductor 211 and the second signal conductor 221.

A plurality of the interlayer connection conductors 422 have a gap between them along the length direction of the dielectric base body 90. The plurality of the interlayer connection conductors 422 is arranged, in planar view of the dielectric base body 90, between the first signal conductor 211 and the second signal conductor 221.

The plurality of the interlayer connection conductors 422 is arranged closer to the second signal conductor 221 side than the plurality of the interlayer connection conductors 412.

A plurality of the interlayer connection conductors 421 have a gap between them along the length direction of the dielectric base body 90. The plurality of the interlayer connection conductors 421 is arranged, in planar view of the dielectric base body 90, between a side surface of the dielectric base body 90 on the second signal conductor 221 side in the width direction and the second signal conductor 221.

Including such interlayer connection conductors 411, 412, 421, and 422 significantly reduces or prevents potential differences between the reference ground conductor 31 and the auxiliary ground conductor 32, thus making it possible to obtain more stable ground potential. Furthermore, the inclusion of the interlayer connection conductors 411, 412, 421, and 422 significantly reduces or prevents leakage of the high frequency signal traveling along the first signal conductor 211 (first transmission line) or the second signal conductor 221 (second transmission line) to outside the transmission line member 10.

Furthermore, the electromagnetic coupling between the first signal conductor 211 and the second signal conductor 221 is significantly reduced or prevented by disposing the interlayer connection conductors 412 and 422 between the first signal conductor 211 and the second signal conductor 221.

In addition to the foregoing configuration, the transmission line member 10 includes coil conductors 212 and 222 and a capacitor-defining plate conductor 213.

As depicted in FIGS. 2B and 2C, the coil conductors 212 and 222 are each a line-shaped conductor pattern defining a meandering shape in planar view. The coil conductor 212 and the capacitor-defining plate conductor 213 are connected to the first signal conductor 211 at intermediate locations. The capacitor-defining plate conductor 213 faces the reference ground conductor 31 and the auxiliary ground conductor 32.

The coil conductor 222 is a line-shaped conductor pattern defining a meandering shape in planar view. The coil conductor 222 is disposed at a location different from that of the second signal conductor 221 in the thickness direction of the dielectric base body 90. Specifically, the coil conductor 222 is disposed between the second signal conductor 221 and the reference ground conductor 31 in the thickness direction of the dielectric base body 90.

As depicted in FIG. 2C and FIG. 3A, one end portion of the coil conductor 222 in its extending direction is connected to the second signal conductor 221 by an interlayer connection conductor 431. The other end portion of the coil conductor 222 in its extending direction is connected to the reference ground conductor 31 by an interlayer connection conductor 432.

With such a structure, the transmission line member 10 enables the realization of the circuit depicted in FIG. 4.

As depicted in FIG. 4, the transmission line member 10 includes the first transmission line 21 connected to the external connection terminal P11 (corresponding to the external connection terminal 511) and the external connection terminal P12 (corresponding to the external connection terminal 512), and further includes the second transmission line 22 connected to the external connection terminal P21 (corresponding to the external connection terminal 521) and the external connection terminal P22 (corresponding to the external connection terminal 522).

An inductor L1 is connected in series to the first signal conductor 21 of the first transmission line 21, and a capacitor C1 is connected between the first signal conductor 21 and ground. The inductor L1 is realized with the coil conductor 212. The capacitor C1 is realized with opposing shapes of the capacitor-defining plate conductor 213 and the reference ground conductor 31 and opposing shapes of the capacitor-defining plate conductor 213 and the auxiliary ground conductor 32.

A low pass filter (low band pass filter) LPF is realized with the inductor L1 and the capacitor C1. In this case, as depicted in FIG. 5, the low pass filter LPF is set in such a way that a fundamental frequency f1 of a first high frequency signal traveling along the first transmission line 21 falls within the passband of the low pass filter LPF and that frequencies (fundamental frequency and its harmonics frequencies) of a second high frequency signal traveling along the second transmission line 22 fall within the attenuation band thereof, by appropriately adjusting device parameters of the inductor L1 and the capacitor C1, or by appropriately setting the shapes of the coil conductor 212 and the capacitor-defining plate conductor 213.

An inductor L2 is connected between the second signal conductor 22 and ground. The inductor L2 is realized with the coil conductor 222.

A high pass filter (high band pass filter) HPF is realized with the inductor L2. In this case, as depicted in FIG. 5, the high pass filter HPF is set in such a way that the fundamental frequency f2 of the second high frequency signal traveling along the second transmission line 22 falls within the passband of the high pass filter HPF and that frequencies (fundamental frequency and harmonics frequencies) of the first high frequency signal traveling along the first transmission line fall within the attenuation band thereof, by appropriately adjusting device parameters of the inductor L2, or by appropriately setting the shape of the coil conductor 222.

With such a structure, even in a case that the first high frequency signal traveling along the first transmission line 21 is leaked to the second transmission line 22, the high pass filter HPF attenuates the leaked signal and does not allow the leaked signal to be transmitted to outside from the external connection terminal 521 or 522. Similarly, even in a case that the second high frequency signal traveling along the second transmission line 22 is leaked to the first transmission line 21, the low pass filter LPF attenuates the leaked signal and does not allow the leaked signal to be transmitted to outside from the external connection terminal 511 or 512. This significantly reduces or prevents degradation in transmission characteristics of the transmission line member 10.

As described above, using the configuration of the present preferred embodiment enables the formation of a thin small transmission line member having superior transmission characteristics while including a plurality of transmission lines.

The transmission line member 10 having such a structure is preferably fabricated, for example, in the following manner.

First, a dielectric film (corresponding to the dielectric layer) having copper cladding on the entire surface at one side is prepared. In the present preferred embodiment, liquid crystal polymer is used as the dielectric film.

The reference ground conductor 31 is formed on one side surface of a first dielectric film (corresponding to the dielectric layer 91). The coil conductor 222 is formed on one side surface of a second dielectric film (corresponding to the dielectric layer 92) by patterning. The first signal conductor 211, the coil conductor 212, the capacitor-defining plate conductor 213, and the second signal conductor 221 are formed on one side surface of a third dielectric film (corresponding to the dielectric layer 93) by patterning. The auxiliary ground conductor 32 is formed on one side surface of a fourth dielectric film (corresponding to the dielectric layer 94).

Through holes are formed by directing a laser beam to predetermined locations at these dielectric films, and conductor portions are formed by filling the through holes with electrically conductive paste. These conductor portions serve as bases for the interlayer connection conductors 411, 412, 421, 422, 431, and 432.

These dielectric films are stacked, subjected to thermocompression bonding, and separated into individual pieces, thus forming the dielectric base bodies 10.

Furthermore, the external connection terminals 511, 512, 521, and 522 are mounted on the extraction portions disposed at both end portions of the dielectric base body 10 in the length direction.

Figure 6A:
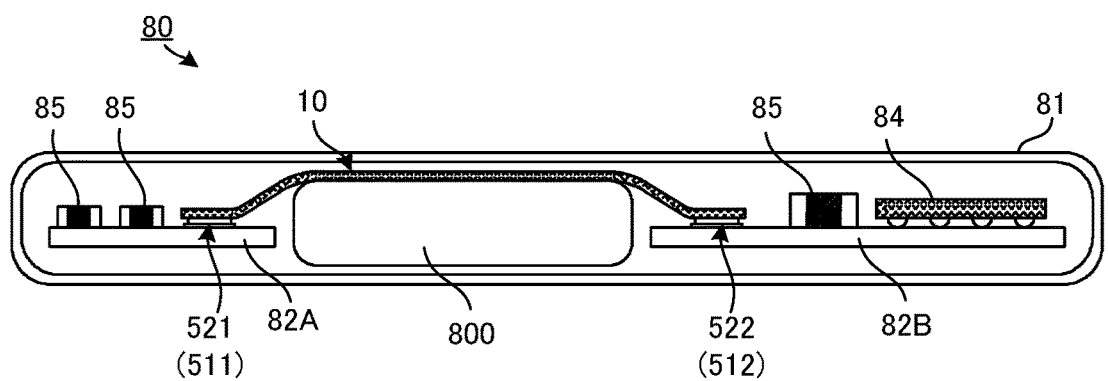
FIGS. 6A and 6B are a cross sectional side view and a cross sectional plan view of a component configuration of a mobile electronic apparatus according to the first preferred embodiment of the present invention.
Figure 6B:
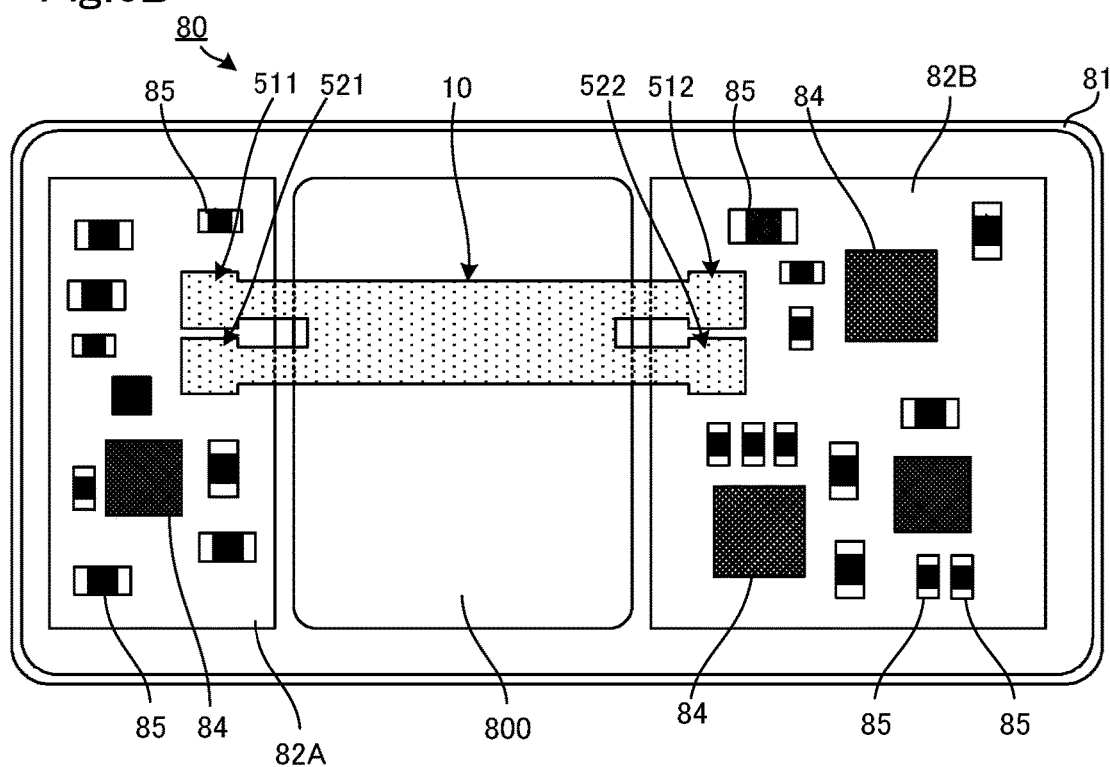

The transmission line member having such a structure is mounted on an electronic apparatus described below. FIG. 6A is a cross sectional side view depicting the component configuration of a mobile electronic apparatus according to the first preferred embodiment of the present invention, and FIG. 6B is a cross sectional plan view that describes the component configuration of a mobile electronic apparatus.

A mobile electronic apparatus 80 includes a thin apparatus housing 81. Inside the apparatus housing 81, mount circuit boards 82A and 82B serving as circuit elements and a battery pack 800 are disposed. On surfaces of the mount circuit boards 82A and 82B, a plurality of IC chips 84 and a plurality of mounted components 85 are mounted. In planar view of the apparatus housing 81, the battery pack 800 is arranged between the mount circuit boards 82A and 82B. Here, the apparatus housing 81 is formed to have a minimum possible thickness, and thus the gap between the apparatus housing 81 and the battery pack 800 is very narrow in the thickness direction of the apparatus housing 81. Accordingly, a coaxial cable cannot be disposed between the apparatus housing 81 and the battery pack 800.

On the other hand, the transmission line member 10 described in the present preferred embodiment is able to be interposed between the battery pack 800 and the apparatus housing 81 by arranging the transmission line member 10 in such a way that the thickness direction of the transmission line member 10 coincides with the thickness direction of the apparatus housing 81. In this way, the transmission line member 10 is able to connect the mount circuit boards 82A and 82B that are separated from each other while having the battery pack 800 between them.

Furthermore, the transmission line member 10 makes it possible to transmit a plurality of high frequency signals in close proximity to each other, thus making it possible to reduce an area from which the plurality of high frequency signals is transmitted and to conserve space. In this case, using the transmission line member 10 of the present preferred embodiment makes it possible to transmit each high frequency signal with reduced transmission loss. Furthermore, the second high frequency signal is not transmitted to a circuit that utilizes the first high frequency signal, and the first high frequency signal is not transmitted to a circuit that utilizes the second high frequency signal. This significantly reduces or prevents degradation in circuit functionality in each of the circuits that utilize their respective high frequency signals.

Next, a transmission line member according to a second preferred embodiment of the present invention is described with reference to the drawings. FIGS. 7A to 7D are exploded plan views depicting a structure of a transmission line member according to the second preferred embodiment of the present invention.

A transmission line member 10A according to the present preferred embodiment has a configuration that corresponds to the transmission line member 10 according to the first preferred embodiment except that the interlayer connection conductors 412 and 422 are omitted from that configuration.

Such a structure enables the reduction of the width of the transmission line member 10A. Furthermore, such a structure further improves the flexibility of the transmission line member 10A.

In this case, as described in the first preferred embodiment, the filter devices are respectively provided at the first transmission line 21 and the second transmission line 22. Accordingly, even in a case that the first high frequency signal leaks to the second transmission line 22 or the second high frequency signal leaks to the first transmission line 21 due to the omission of the interlayer connection conductors 412 and 422, the transmission line member 10A makes it possible to significantly reduce or prevent leaked signals from being transmitted to outside.

In the present preferred embodiment, an example is described in which no interlayer connection conductor is provided between the first signal conductor 211 and the second signal conductor 221. Alternatively, such interlayer connection conductors may be disposed with a lower arrangement density, compared with the arrangement density of the interlayer connection conductors 411 disposed between the first signal conductor 211 and a side surface and the arrangement density of the interlayer connection conductors 421 disposed between the second signal conductor 221 and a side surface. Even in this example, the flexibility of the transmission line member 10A is improved, compared with the transmission line member 10 according to the first preferred embodiment.

Figure 8A:
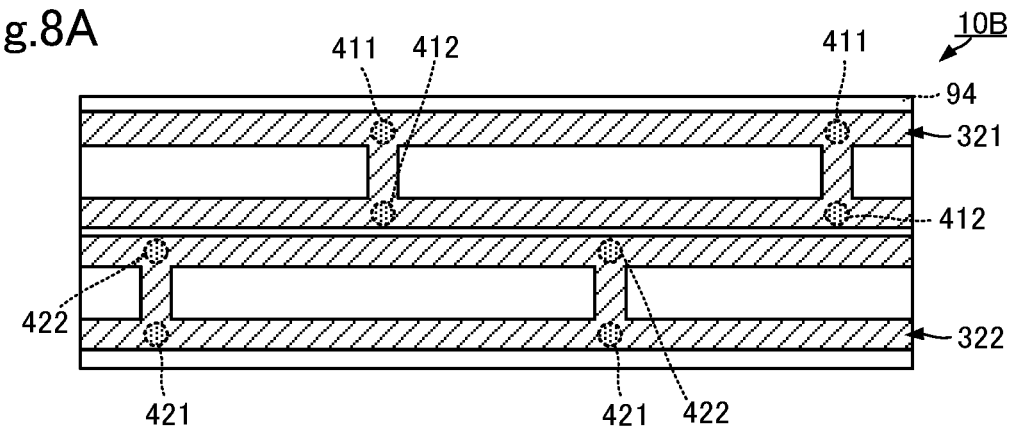
FIGS. 8A to 8C are exploded plan views depicting a structure of a transmission line member according to a third preferred embodiment of the present invention.
Figure 8B:
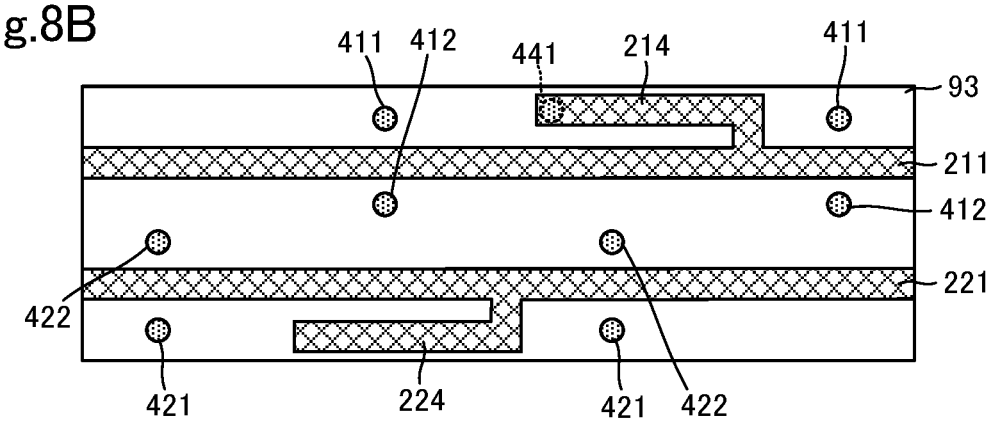
Figure 8C:
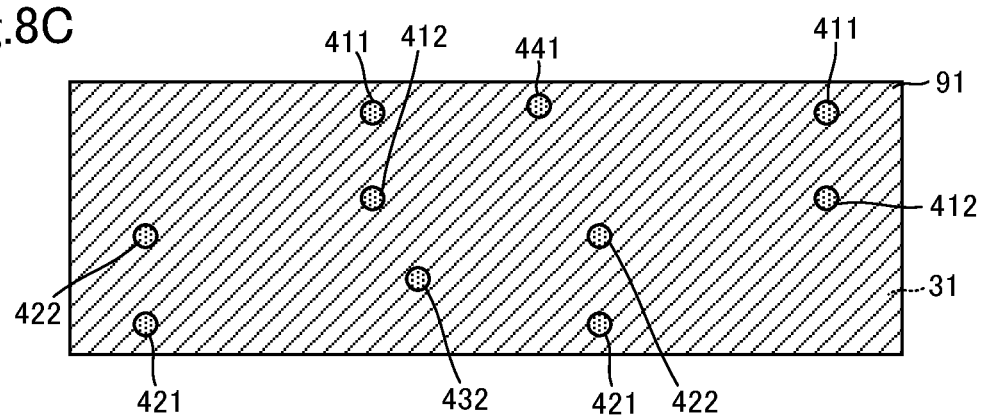

Next, a transmission line member according to a third preferred embodiment of the present invention is described with reference to the drawings. FIGS. 8A to 8C are exploded plan views depicting a structure of a transmission line member according to the third preferred embodiment of the present invention.

A transmission line member 10B according to the present preferred embodiment differs from the transmission line member 10 according to the first preferred embodiment in structure of the auxiliary ground conductor and in configuration of the filter device.

The first signal conductor 211 and the second signal conductor 221 each have an elongated shape extending along the length direction of the dielectric base body 90.

At an intermediate point along the length direction of the first signal conductor 211, a line-shaped stub conductor 214 is connected. The length of the stub conductor 214 is about a quarter of the wavelength of the first high frequency signal. A top end portion of the stub conductor 214 is connected to the reference ground conductor 31 by an interlayer connection conductor 441. This defines a short stub and provides a bandpass filter BPF for the first high frequency signal.

At an intermediate point along the length direction of the second signal conductor 221, a line-shaped stub conductor 224 is connected. The length of the stub conductor 224 is about a quarter of the wavelength of the first high frequency signal. A top end portion of the stub conductor 224 is not connected to any conductor. This defines an open stub and provides a band elimination filter BEF for the first high frequency signal.

Figure 9:
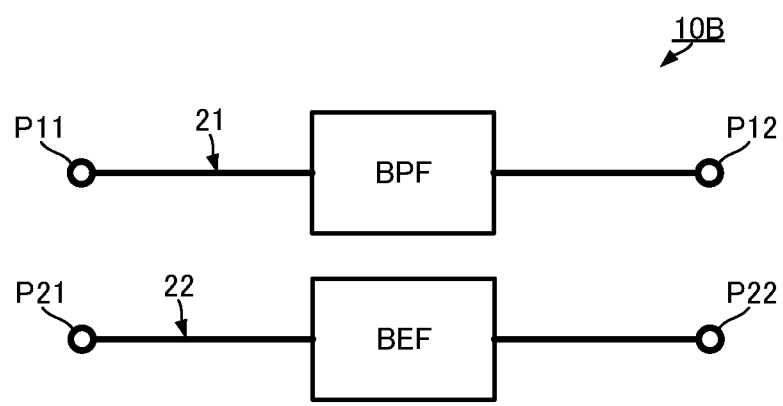
FIG. 9 is an equivalent circuit diagram of the transmission line member according to the third preferred embodiment of the present invention.
Figure 10:
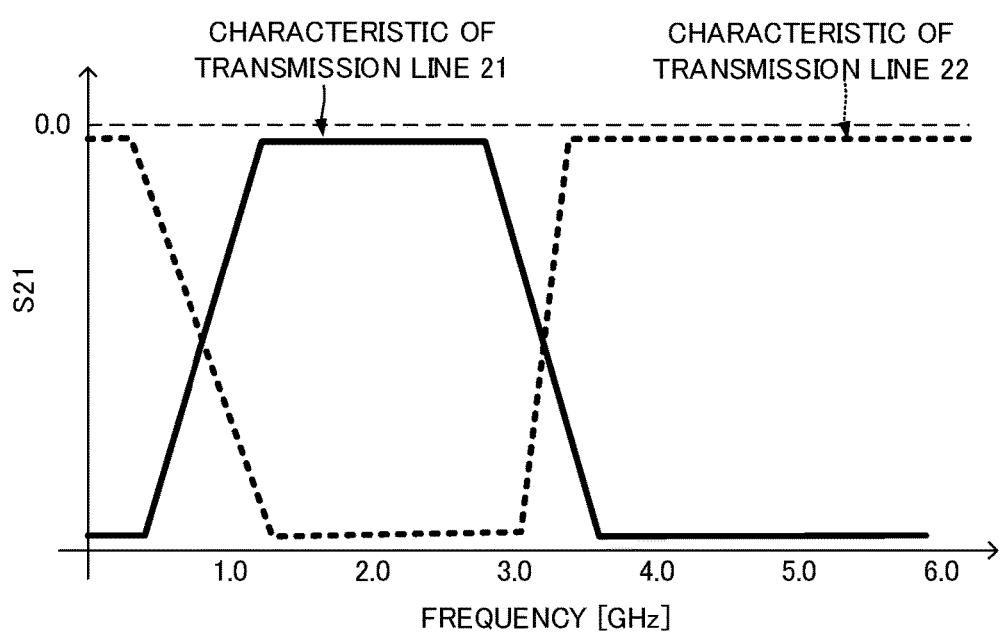
FIG. 10 is a diagram depicting a filter characteristic of the transmission line member according to the third preferred embodiment of the present invention.

This enables the realization of a circuit depicted in FIG. 9 having a filter characteristic depicted in FIG. 10. FIG. 9 is an equivalent circuit diagram of the transmission line member according to the third preferred embodiment of the present invention. FIG. 10 is a diagram depicting the filter characteristic of the transmission line member according to the third preferred embodiment of the present invention.

With the configuration described above, even in a case that the first high frequency signal traveling along the first transmission line 21 leaks to the second transmission line 22, the band elimination filter BEF makes it possible to attenuate the leaked signal, and the leaked signal is not transmitted to outside from the external connection terminals 521 and 522. Furthermore, even in a case that the second high frequency signal traveling along the second transmission line 22 leaks to the first transmission line 21, the leaked signal is attenuated due to the attenuation characteristic of the band pass filter BPF and is not transmitted to outside from the external connection terminals 511 and 512. This significantly reduces or prevents degradation in transmission characteristics of the transmission line member 10B.

Furthermore, as described in the present preferred embodiment, forming the filters using the stub conductors enables the formation of filter components at the same layer (same location in the thickness direction) as the first signal conductor 211 and the second signal conductor 221. This enables the realization of the transmission line member 10B having less thickness.

Auxiliary ground conductors 321 and 322 are disposed along the width direction of the dielectric base body 90. The auxiliary ground conductors 321 and 322 are each including a ladder-shaped conductor. Specifically, the auxiliary ground conductors 321 and 322 each include two elongated conductors extending along the length direction of the dielectric base body 90. The two elongated conductors are arranged so as to have a gap between them along the width direction of the dielectric base body 90. The two elongated conductors are connected at locations that are spaced from each other along the length direction. This causes each of the auxiliary ground conductors 321 and 322 to have a shape in which a plurality of openings is lined along the length direction. In this case, the auxiliary ground conductor 321 is arranged in such a way that an opened area overlaps the first signal conductor 211 in planar view, and the auxiliary ground conductor 322 is arranged in such a way that an opened area overlaps the second signal conductor 221 in planar view.

Such a structure significantly reduces or prevents capacitive coupling between the auxiliary ground conductor 321 and the first signal conductor 211, and further enables the reduction of the gap between the auxiliary ground conductor 321 and the first signal conductor 211, compared with an example where the auxiliary ground conductor 32 covers the entire surface. Similarly, such a structure enables the reduction of the gap between the auxiliary ground conductor 322 and the second signal conductor 221. This makes it possible to further reduce the thickness of the dielectric base body 90, namely, the transmission line member 10B.

In the present preferred embodiment, the example is described in which the stub conductor 214 is arranged on a side surface side of the first signal conductor 211 and the stub conductor 224 is arranged on a side surface side of the second signal conductor 221. Alternatively, at least one of these stub conductors may be arranged between the first signal conductor 211 and the second signal conductor 221. Note that, however, with the example described in the present preferred embodiment, a wider space is secured between a conductor group including the first signal conductor 211 and the stub conductor 214 and a conductor group including the second signal conductor 221 and the stub conductor 224. Accordingly, the leakage of high frequency signal may be significantly reduced or prevented between the filter devices in the first transmission line and the second transmission line. Thus, this alternative is more preferable.

Figure 11:
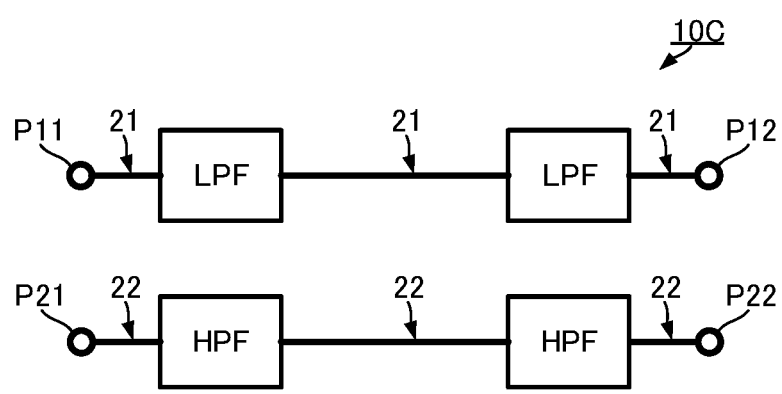
FIG. 11 is an equivalent circuit diagram of a transmission line member according to a fourth preferred embodiment of the present invention.

Next, a transmission line member according to a fourth preferred embodiment of the present invention is described with reference to the drawings. FIG. 11 is an equivalent circuit diagram of the transmission line member according to the fourth preferred embodiment of the present invention.

The foregoing preferred embodiments each describe the example in which a single filter device is disposed at each of the first transmission line and the second transmission line. However, as depicted in FIG. 11, in a transmission line member 10C according to the present preferred embodiment, each of the first transmission line 21 and the second transmission line 22 is connected to two filter devices.

Specifically, in the case of FIG. 11, two low pass filters LPF are connected to the first transmission line 21. One of the low pass filters LPF is connected in the vicinity of the external connection terminal P11, and the other low pass filter LPF is connected in the vicinity of the external connection terminal P12. Two high pass filters HPF are connected to the second transmission line 22. One of the high pass filters HPF is connected in the vicinity of the external connection terminal P21, and the other high pass filter HPF is connected in the vicinity of the external connection terminal P22. The low pass filters LPF and the high pass filters HPF have filter characteristics similar to those of FIG. 5 described in the first preferred embodiment.

Preferably, these filters are located near end portions connecting to the extraction portions in the main portion of the transmission line member 10C. Alternatively, extraction portions may be provided at these filters.

Such a structure makes it possible to significantly reduce or prevent, more reliably, outbound leakage of the first high frequency signal, which was leaked from the first transmission line 21 to the second transmission line 22, and outbound leakage of the second high frequency signal, which was leaked from the second transmission line 22 to the first transmission line 21.

The foregoing preferred embodiments each describe the example in which a pair of low pass filter and high pass filter or a pair of band pass filter and band elimination filter is preferably used. However, the combination of filters is not limited thereto, and may alternatively be, but not limited to, a pair of band pass filters having different pass bands. Specifically, a filter connected to the first transmission line may have characteristics such that the fundamental frequency of the first high frequency signal falls in a pass band of the filter whereas the frequency of the second high frequency signal falls in an attenuation band of the filter, and a filter connected to the second transmission line may have characteristics such that the fundamental frequency of the second high frequency signal falls in a pass band of the filter whereas the frequency of the first high frequency signal falls in an attenuation band of the filter.

Furthermore, in the respective foregoing preferred embodiments, the examples are described in which filters are defined by conductor patterns. Alternatively, a mounted component may be used. Furthermore, a circuit device including a conductor pattern and the mounted component may be combined. Note that, however, forming the filters only from the conductor patterns enables the realization of a thinner transmission line member having superior flexibility.

Furthermore, in the foregoing preferred embodiments, the examples are described in which the filter device preferably is connected to each of the first transmission line and the second transmission line. Alternatively, in some preferred embodiment, the filter device may be connected to at least one of the first transmission line and the second transmission line. For example, in some preferred embodiments, the filter device may be connected only to a transmission line in which a high S/N ratio is desired.

Figure 13:
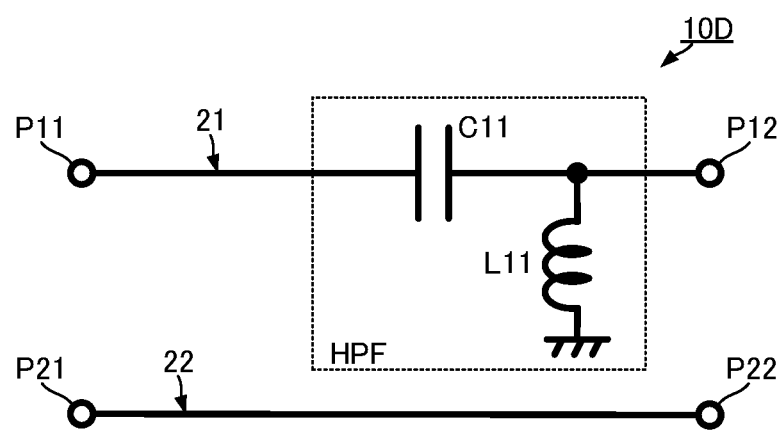
FIG. 13 is an equivalent circuit diagram of the transmission line member according to the fifth preferred embodiment of the present invention.
Figure 14A:
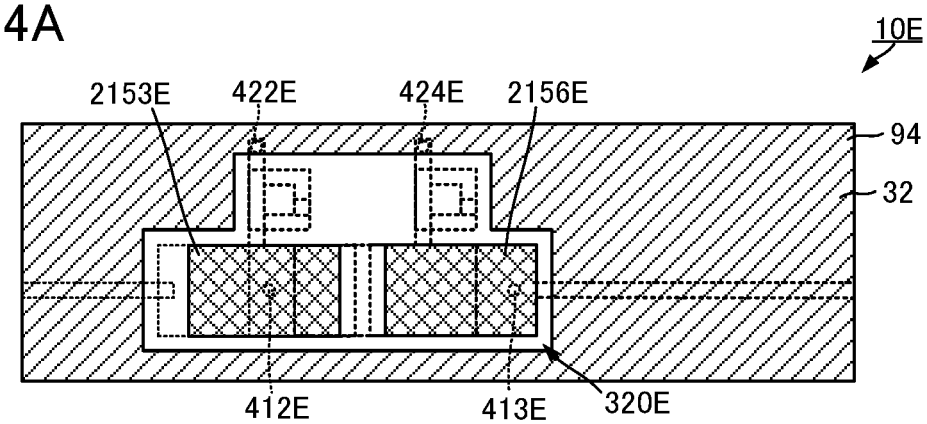
FIGS. 14A to 14D are exploded plan views depicting a structure of a transmission line member according to a sixth preferred embodiment of the present invention.
Figure 14B:
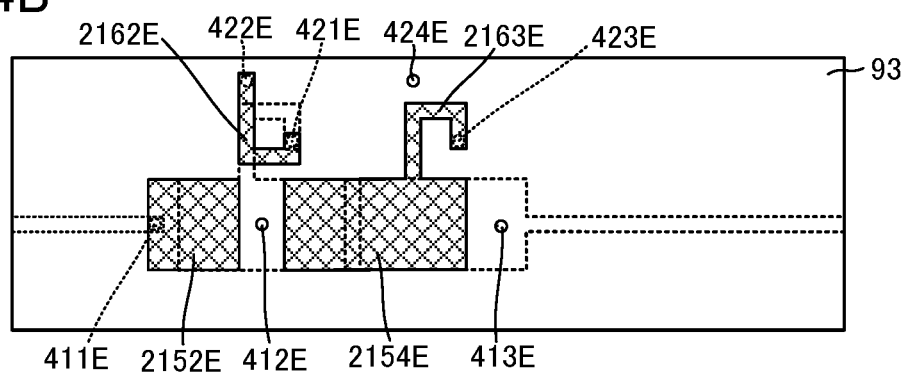
Figure 14C:
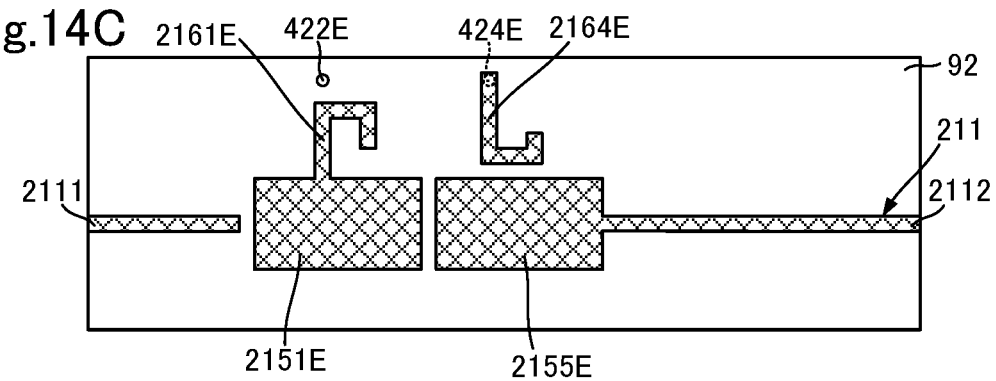
Figure 14D:
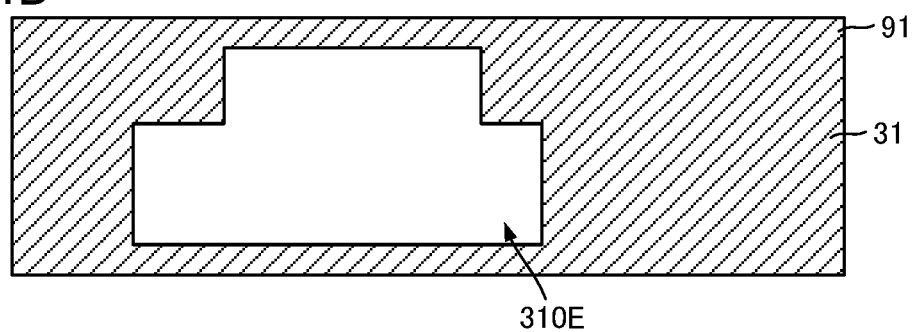

Next, a transmission line member according to a fifth preferred embodiment of the present invention is described with reference to the drawings. FIGS. 12A to 12D are exploded plan views depicting a structure of a transmission line member according to the fifth preferred embodiment of the present invention. FIG. 13 is an equivalent circuit diagram of the transmission line member according to the fifth preferred embodiment of the present invention.

A transmission line member 10D according to the present preferred embodiment differs from the transmission line member according to the first preferred embodiment in configurations of the filter device and the ground conductor. Here, in the present preferred embodiment, an example will be described in which only the first transmission line includes the filter device. Alternatively, in some preferred embodiments, the configuration of the present preferred embodiment may be applied to the second transmission line, or the second transmission line may include another filter device while the first transmission line including the filter device of the present preferred embodiment.

A dielectric base body defining the transmission line member 10D is formed preferably by sequentially stacking dielectric layers 91, 92, 93, and 94 from one end of the thickness direction.

On a surface of the dielectric layer 92, a first signal conductor 211 is provided. The first signal conductor 211 is an elongated line-shaped conductor extending along a transmission direction of high frequency signal. The first signal conductor 211 is partially cut at an intermediate point in its extending direction. In this way, the first signal conductor 211 is including line-shaped conductor patterns 2111 and 2112.

On the surface of the dielectric layer 92, a capacitor-defining plate conductor 2151 is provided. The capacitor-defining plate conductor 2151 is disposed at an end portion of the line-shaped conductor pattern 2112 on the side closer to the line-shaped conductor pattern 2111. The capacitor-defining plate conductor 2151 preferably has a rectangular or substantially rectangular shape whose width is wider than that of the line-shaped conductor pattern 2112.

On the surface of the dielectric layer 92, a coil conductor 2161 is provided. The coil conductor 2161 preferably has an unclosed ring shape in planar view. One end portion of the coil conductor 2161 in its extending direction is connected to the capacitor-defining plate conductor 2151.

On a surface of the dielectric layer 93, a capacitor-defining plate conductor 2152 is provided. The capacitor-defining plate conductor 2152 preferably has a rectangular or substantially rectangular shape with a width wider than the line-shaped conductor patterns 2111 and 2112. The capacitor-defining plate conductor 2152 partially overlaps the capacitor-defining plate conductor 2151 in a state of dielectric base body. The capacitor-defining plate conductor 2152 is connected to the line-shaped conductor pattern 2111 by an interlayer connection conductor 411 provided in the dielectric layer 93.

On the surface of the dielectric layer 93, a coil conductor 2162 is provided. The coil conductor 2162 preferably has an unclosed ring shape in planar view. One end portion of the coil conductor 2162 in its extending direction is connected to the other end portion of the coil conductor 2161 by an interlayer connection conductor 421 in the dielectric layer 93. The other end portion of the coil conductor 2162 in its extending direction is connected to an auxiliary ground conductor 32 on a surface of the dielectric layer 94 via an interlayer connection conductor 422 in the dielectric layer 94.

On a surface of the dielectric layer 94, the auxiliary ground conductor 32 preferably extends over substantially the entire area of the dielectric layer 94. The auxiliary ground conductor 32 includes an opening 320D in which no conductor is provided. The opening 320D preferably includes, in the structure of the dielectric base body, a formation region of the capacitor-defining plate conductors 2151 and 2152, an opening portion of winding defined by the coil conductors 2161 and 2162, and conductor pattern portions that define the coil conductors 2161 and 2162.

On a surface of the dielectric layer 91, a reference ground conductor 31 preferably extends over substantially the entire area of the dielectric layer 91. The reference ground conductor 31 includes an opening 310D in which no conductor is provided. The opening 310D preferably includes, in the structure of the dielectric base body, the formation region of the capacitor-defining plate conductors 2151 and 2152, the opening portion of winding defined by the coil conductors 2161 and 2162, and the conductor pattern portions that define the coil conductors 2161 and 2162.

Such a structure enables the realization of the circuit depicted in FIG. 13. The transmission line member 10D includes a capacitor C11 connected in series to a first transmission line 21 and an inductor L11 connected between ground and the capacitor C11 at the other end portion P12 side of the first transmission line 21.

The capacitor C11 is realized with opposing shapes of the capacitor-defining plate conductors 2151 and 2152. The inductor L11 is realized with the coil conductors 2161 and 2162 and the interlayer connection conductors 421 and 422 connecting to these coil conductors 2161 and 2162.

This enables the realization of a two-stage high band pass filter (HPF) for the signal transmission direction. Even with such a structure, functions and effects similar to those in the foregoing preferred embodiments are achieved.

Furthermore, in the transmission line member 10D according to the present preferred embodiment, including the openings 310D and 320D significantly reduces or prevents parasitic capacitance generated between the capacitor C11 and the ground conductor. Furthermore, this makes it possible to significantly reduce or prevent unnecessary control of a magnetic field generated at the inductor L11 by the ground conductors. This significantly reduces or prevents degradation in filter characteristics of the high band pass filter such as, but not limited to, the passband characteristic and the attenuation characteristic, thus facilitating achievement of desired filter characteristics.

Figure 15:
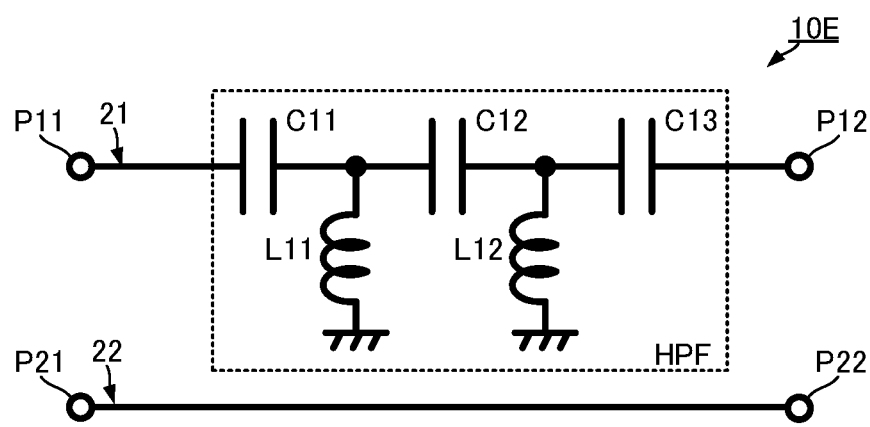
FIG. 15 is an equivalent circuit diagram of the transmission line member according to the sixth preferred embodiment of the present invention.
Figure 16A:
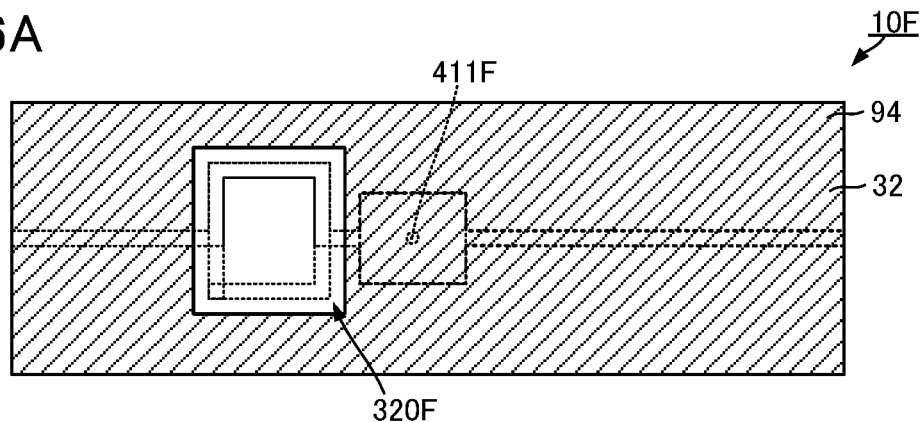
FIGS. 16A to 16D are exploded plan views depicting a structure of a transmission line member according to a seventh preferred embodiment of the present invention.
Figure 16B:
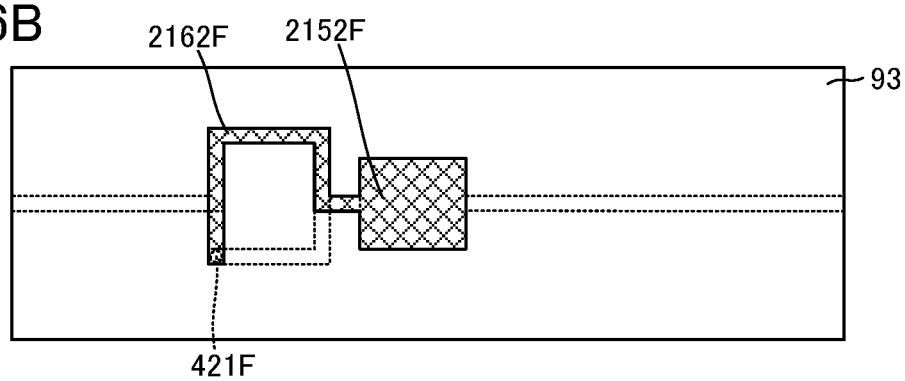
Figure 16C:
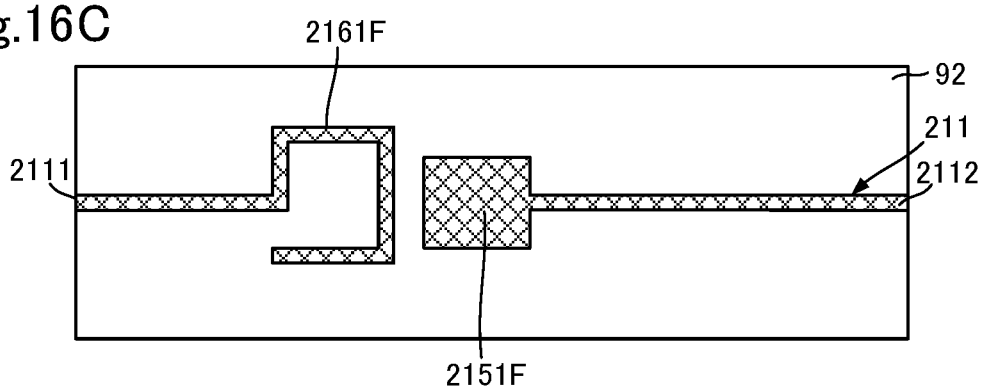
Figure 16D:
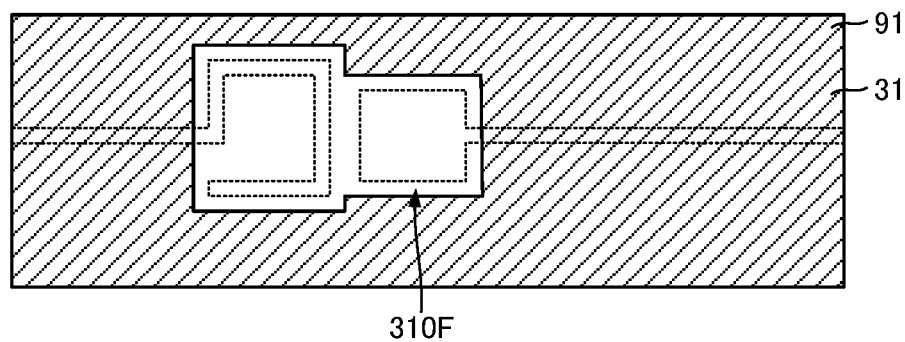

Next, a transmission line member according to a sixth preferred embodiment of the present invention is described with reference to the drawings. FIGS. 14A to 14D are exploded plan views depicting a structure of a transmission line member according to the sixth preferred embodiment of the present invention. FIG. 15 is an equivalent circuit diagram of the transmission line member according to the sixth preferred embodiment of the present invention.

A transmission line member 10E according to the present preferred embodiment differs from the transmission line member according to the first preferred embodiment in the configuration of the filter device and the ground conductors.

Here, in the present preferred embodiment, an example will be described in which only a first transmission line includes the filter device. Alternatively, in some preferred embodiment, the configuration of the present preferred embodiment may be applied to the second transmission line, or the second transmission line may include another filter device while the first transmission line including the filter device of the present preferred embodiment.

A dielectric base body constituting the transmission line member 10E is formed preferably by sequentially stacking dielectric layers 91, 92, 93, and 94 from one end of the thickness direction.

On a surface of the dielectric layer 92, a first signal conductor 211 is provided. The first signal conductor 211 is a line-shaped conductor extending along a transmission direction of high frequency signal. The first signal conductor 211 is partially cut at an intermediate point along its extending direction. In this way, the first signal conductor 211 is including line-shaped conductor patterns 2111 and 2112.

On the surface of the dielectric layer 92, capacitor-defining plate conductors 2151E and 2155E are provided. The capacitor-defining plate conductor 2155E is disposed at an end portion of the line-shaped conductor pattern 2112 on the side closer to the line-shaped conductor pattern 2111. The capacitor-defining plate conductor 2151E is disposed between the line-shaped conductor pattern 2111 and the capacitor-defining plate conductor 2155E. The capacitor-defining plate conductors 2151E and 2155E each preferably have a rectangular or substantially rectangular shape with a width wider than the line-shaped conductor pattern 2112.

On the surface of the dielectric layer 92, coil conductors 2161E and 2164E are provided. The coil conductor 2161E and 2164E each preferably have an unclosed ring shape in planar view. One end portion of the coil conductor 2161E in its extending direction is connected to the capacitor-defining plate conductor 2151E.

On a surface of the dielectric layer 93, capacitor-defining plate conductors 2152E and 2154E are provided. The capacitor-defining plate conductors 2152E and 2154E each preferably have a rectangular or substantially rectangular shape with a width wider than the line-shaped conductor patterns 2111 and 2112. The capacitor-defining plate conductor 2152E partially overlaps the capacitor-defining plate conductor 2151E in the structure of the dielectric base body. The capacitor-defining plate conductor 2152E is connected to the line-shaped conductor pattern 2111 by an interlayer connection conductor 411E in the dielectric layer 93. The capacitor-defining plate conductor 2154E partially overlaps the capacitor-defining plate conductor 2151E and the capacitor-defining plate conductor 2155E in the structure of the dielectric base body.

On the surface of the dielectric layer 93, coil conductors 2162E and 2163E are provided. The coil conductors 2162E and 2163E each preferably have an unclosed ring shape in planar view. One end portion of the coil conductor 2162E in its extending direction is connected to the other end portion of the coil conductor 2161E by an interlayer connection conductor 421E in the dielectric layer 93. The other end portion of the coil conductor 2162E in its extending direction is connected to an auxiliary ground conductor 32 on a surface of the dielectric layer 94 by an interlayer connection conductor 422E in the dielectric layer 94. One end portion of the coil conductor 2163E in its extending direction is connected to the capacitor-defining plate conductor 2154E. The other end portion of the coil conductor 2163E in its extending direction is connected to one end portion of the coil conductor 2164E by an interlayer connection conductor 423E formed in the dielectric layer 93. Here, the other end portion of the coil conductor 2164E is connected to a reference ground conductor and the auxiliary ground conductor 32 by an interlayer connection conductor 424E formed in the dielectric layers 92, 93, and 94.

On a surface of the dielectric layer 94, the auxiliary ground conductor 32 preferably extends over substantially the entire area of the dielectric layer 94. The auxiliary ground conductor 32 includes an opening 320E in which no conductor is provided. The opening 320E preferably includes, in the structure of the dielectric base body, formation regions of the capacitor-defining plate conductors 2151E, 2152E, 2154E and 2155E, opening portions of windings defined by the coil conductors 2161E, 2162E, 2163E, and 2164E, and conductor pattern portions that define the coil conductors 2161E, 2162E, 2163E, and 2164E.

Inside the opening 320E, capacitor-defining plate conductors 2153E and 2156E are provided. The capacitor-defining plate conductor 2153E is arranged so as to partially overlap the capacitor-defining plate conductors 2152E and 2154E in the structure of the dielectric base body. The capacitor-defining plate conductor 2156E is arranged so as to partially overlap the capacitor-defining plate conductors 2154E and 2155E in the structure of the dielectric base body. The capacitor-defining plate conductor 2156E is connected to the capacitor-defining conductor 2155E by an interlayer connection conductor 413E in the dielectric layers 93 and 94.

On a surface of the dielectric layer 91, the reference ground conductor 31 preferably extends over substantially the entire area of the dielectric layer 91. The reference ground conductor 31 includes an opening 310E in which no conductor is provided. The opening 310E preferably includes, in the structure of the dielectric base body, formation regions of the capacitor-defining plate conductors 2151E, 2152E, 2153E, 2154E, 2155E, and 2156E, opening portions of windings defined by the coil conductors 2161E, 2162E, 2163E, and 2164E, and conductor pattern portions that define the coil conductors 2161E, 2162E, 2163E, and 2164E.

A capacitor C11 is realized with opposing shapes of the capacitor-defining plate conductors 2151E and 2152E and opposing shapes of the capacitor-defining plate conductors 2152E and 2153E. A capacitor C12 is realized with opposing shapes of the capacitor-defining plate conductors 2151E and 2154E and opposing shapes of the capacitor-defining plate conductors 2153E and 2154E. A capacitor C13 is realized with opposing shapes of the capacitor-defining plate conductors 2154E and 2155E and opposing shapes of the capacitor-defining plate conductors 2154E and 2156E. An inductor L11 is realized with the coil conductors 2161E and 2162E and the interlayer connection conductors 421E and 422E connecting to these coil conductors 2161E and 2162E. An inductor L12 is realized with the coil conductors 2163E and 2164E and the interlayer connection conductors 423E and 424E connecting to these coil conductors 2163E and 2164E.

The foregoing configuration enables the realization of the circuit depicted in FIG. 15. The transmission line member 10D includes the capacitors C11, C12, and C13 connected in series to a first transmission line 21, the inductor L11 connected between ground and a connection point of the capacitor C11 and the capacitor C12, and the inductor L12 connected between ground and a connection point of the capacitor C12 and the capacitor C13. This enables the realization of a five-stage high band pass filter (HPF) with respect to the signal transmission direction. Even with such a structure, functions and effects similar to those in the respective foregoing preferred embodiments may be obtained.

Furthermore, in the transmission line member 10E according to the present preferred embodiment, including the openings 310E and 320E significantly reduces or prevents parasitic capacitance generated between the capacitor C11 and the ground conductor. Furthermore, this makes it possible to significantly reduce or prevent unnecessary control of a magnetic field generated at the inductor L11 by the ground conductors. This significantly reduces or prevents degradation in filter characteristics of the high band pass filter such as, but not limited to, the passband characteristic and the attenuation characteristic, thus facilitating achievement of desired filter characteristics. Furthermore, there is no need to additionally provide the capacitor-defining plate conductors 2153E and 2156E because the capacitor-defining plate conductors 2153E and 2156E are provided inside the opening 320E, thus making it possible to provide a thinner dielectric base body.

Figure 17:
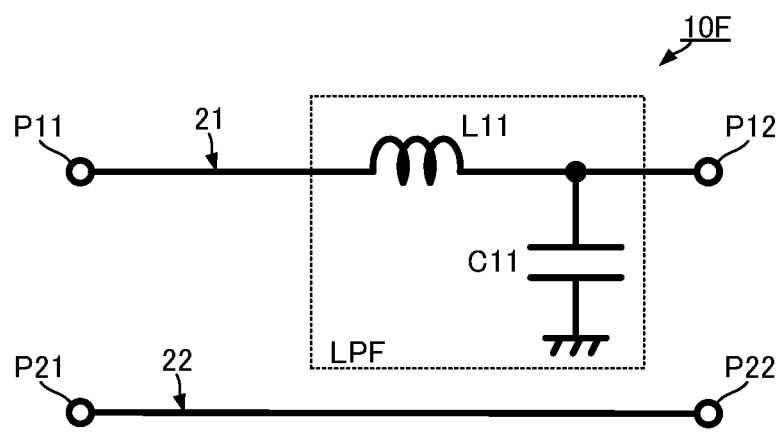
FIG. 17 is an equivalent circuit diagram of the transmission line member according to the seventh preferred embodiment of the present invention.

Next, a transmission line member according to a seventh preferred embodiment of the present invention is described with reference to the drawings. FIGS. 16A to 16D are exploded plan views depicting a structure of a transmission line member according to the seventh preferred embodiment of the present invention. FIG. 17 is an equivalent circuit diagram of the transmission line member according to the seventh preferred embodiment of the present invention.

A transmission line member 10F according to the present preferred embodiment differs from the transmission line member according to the first preferred embodiment in configurations of the filter device and the ground conductor. Here, in the present preferred embodiment, an example will be described in which only a first transmission line includes the filter device. Alternatively, in some preferred embodiments, the configuration of the present preferred embodiment may be applied to the second transmission line, or the second transmission line may include another filter element while the first transmission line including the filter element of the present preferred embodiment.

A dielectric base body of the transmission line member 10F is formed preferably by sequentially stacking dielectric layers 91, 92, 93, and 94 from one end of the thickness direction.

On a surface of the dielectric layer 92, a first signal conductor 211 is provided. The first signal conductor 211 is a line-shaped conductor extending along a transmission direction of high frequency signal. The first signal conductor 211 is partially cut at an intermediate point along its extending direction. In this way, the first signal conductor 211 includes line-shaped conductor patterns 2111 and 2112.

On the surface of the dielectric layer 92, a capacitor-defining plate conductor 2151F is provided. The capacitor-defining plate conductor 2151F is disposed at an end portion of the line-shaped conductor pattern 2112 on the side closer to the line-shaped conductor pattern 2111.

The capacitor-defining plate conductor 2151F preferably has a rectangular or substantially rectangular shape with a width wider than the line-shaped conductor pattern 2112.

On the surface of the dielectric layer 92, a coil conductor 2161F is provided. The coil conductor 2161F preferably has an unclosed ring shape in planar view. One end portion of the coil conductor 2161F in its extending direction is connected to an end portion of the line-shaped conductor pattern 2111 on the side closer to the line-shaped conductor pattern 2112.

On a surface of the dielectric layer 93, a capacitor-defining plate conductor 2152F is provided. The capacitor-defining plate conductor 2152F preferably has a rectangular or substantially rectangular shape with a width wider than the line-shaped conductor patterns 2111 and 2112. The capacitor-defining plate conductor 2152F overlaps the capacitor-defining plate conductor 2151F in the structure of the dielectric base body. The capacitor-defining plate conductor 2152F is connected to an auxiliary ground conductor 32 by an interlayer connection conductor 411F in the dielectric layer 94.

On the surface of the dielectric layer 93, a coil conductor 2162F is provided. The coil conductor 2162F preferably has an unclosed ring shape in planar view. One end portion of the coil conductor 2162F in its extending direction is connected to the capacitor-defining plate conductor 2151F provided on the same layer. The other end portion of the coil conductor 2162F in its extending direction is connected to the other end portion of the coil conductor 2161F by an interlayer connection conductor 421F in the dielectric layer 93.

On a surface of the dielectric layer 94, the auxiliary ground conductor 32 preferably extends over substantially the entire area of the dielectric layer 94. The auxiliary ground conductor 32 includes an opening 320F in which no conductor is provided. The opening 320F preferably includes, in the structure of the dielectric base body, an opening portion of winding defined by the coil conductors 2161F and 2162F and conductor pattern portions that define the coil conductors 2161F and 2162F.

On a surface of the dielectric layer 91, a reference ground conductor 31 preferably extends over substantially the entire area of the dielectric layer 91. The reference ground conductor 31 includes an opening 310F in which no conductor is provided. The opening 310F preferably includes, in the structure of the dielectric base body, a formation region of the capacitor-defining plate conductors 2151F and 2152F, an opening portion of winding defined by the coil conductors 2161F and 2162F, and conductor pattern portions that define the coil conductors 2161F and 2162F.

Such a structure enables the realization of a circuit depicted in FIG. 17. The transmission line member 10F includes an inductor L11 connected in series to a first transmission line 21 and a capacitor C11 connected between ground and the inductor L11 at the other end portion P12 side of the first transmission line 21.

The inductor L11 is realized with the coil conductors 2161F and 2162F and the interlayer connection conductor 421F connecting to these coil conductors 2161F and 2162F. The capacitor C11 is realized with opposing shapes of the capacitor-defining plate conductors 2151F and 2152F.

This enables the realization of a two-stage low band pass filter (LPF) with respect to the signal transmission direction. Even with such a structure, functions and effects similar to those in the respective foregoing preferred embodiment may be obtained.

Furthermore, in the transmission line member 10F according to the present preferred embodiment, including the openings 310F and 320F makes it possible to significantly reduce or prevent unnecessary control of a magnetic field generated at the inductor L11 by the ground conductors. Furthermore, this significantly reduces or prevents parasitic capacitance generated between the capacitor C11 and the ground conductor. This significantly reduces or prevents degradation in filter characteristics of the low band pass filter such as, but not limited to, the passband characteristic and the attenuation characteristic, thus facilitating achievement of desired filter characteristics.

The filter devices described in the respective foregoing preferred embodiments may also be used as phase shifters, for example. In other words, the circuit portion of the low band pass filter may be used as a phase shifter that advances the phase of a transmitting high frequency signal, and the circuit portion of the high band pass filter may be used as a phase shifter that delays the phase of a transmitting high frequency signal. In such cases, for each filter, device parameters of the inductors and capacitors may be determined in consideration of an amount of phase to be shifted. For example, the case in which the filter device is used as the phase shifter, such as described above, may be effective even in a case that the first transmission line and the second transmission line are formed separately and a phase shift of a high frequency signal traveling one of the transmission lines is desired. In other words, the foregoing configuration may be used even for a transmission line member 10 in which one transmission line is provided.

In the foregoing filter devices, each filter to be connected to each transmission line is realized with a multi-stage filter (for example, a combination of a high band pass filter including a series-connected capacitor and a high band pass filter including an inductor connected between a signal conductor and ground, and the like). Alternatively, the filter may be a single-stage filter. Note that, however, the attenuation ratio of the filter characteristic is able to be increased by composing a filter connected to a transmission line from a multi-stage filter. Furthermore, the amount phase shift is able to be increased by providing a filter connected to a transmission line from a multi-stage filter.

Even in the case that the filter device is used as a phase shifter, it is preferred to reduce the size of the filter along the transmission direction of high frequency signal when a low band pass filter is used. On the other hand, it is preferable to increase the size of the filter along the transmission direction of high frequency signal when a high band pass filter is used. This makes it possible to achieve a desired amount of phase shift more reliably.

Figure 18:
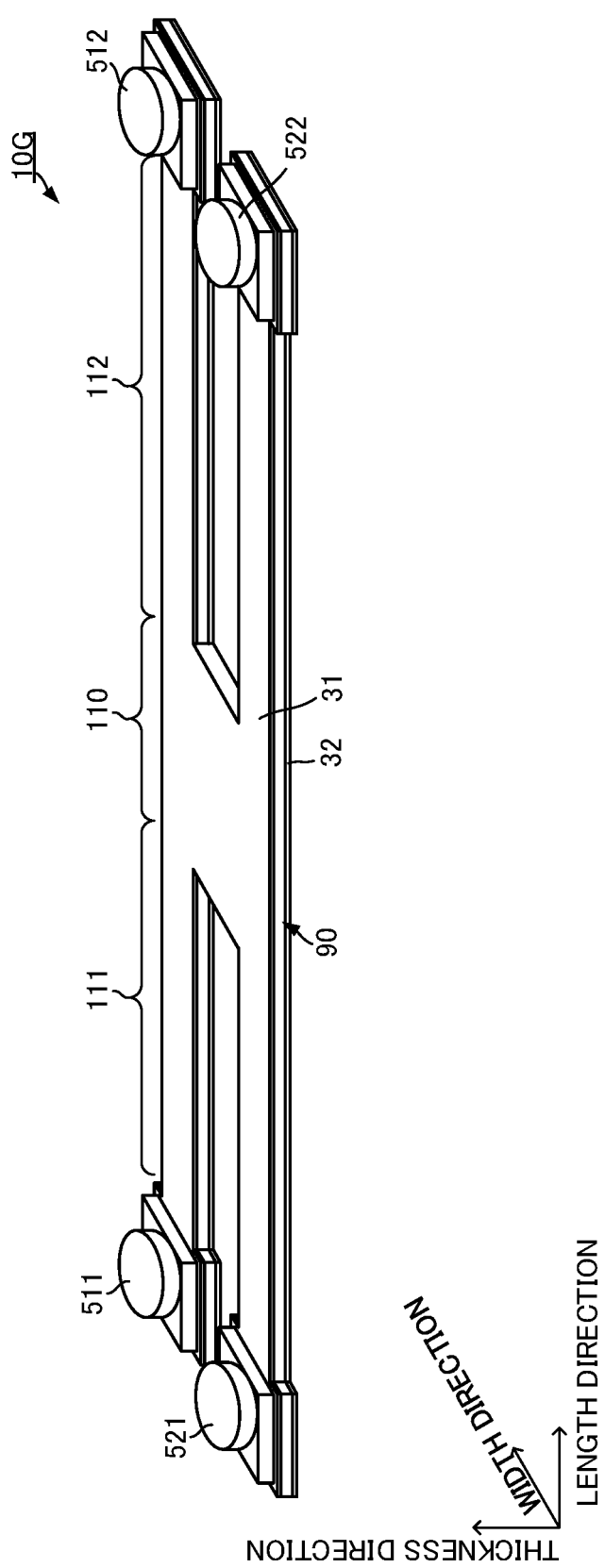
FIG. 18 is an external perspective view of a transmission line member according to another preferred embodiment of the present invention.

In FIG. 1, an example is depicted in which the main portion is longer than the extraction portions in the transmission direction of high frequency signal. Alternatively, a configuration such as depicted in FIG. 18 may be adopted. FIG. 18 is an external perspective view of a transmission line member according to another preferred embodiment of the present invention.

In a transmission line member 10G depicted in FIG. 18, the length of a main portion 110 is shorter than the lengths of extraction portions 111 and 112 in the transmission direction of high frequency signal. Further, the foregoing filter device is provided on the main portion 110.

Such a structure improves the flexibility of the transmission line member 10G. In other words, such a structure enables the realization of the transmission line member 10G that is easy to bend. Furthermore, in ranges of the extraction portions 111 and 112, air gaps are present between the first transmission line and the second transmission line. This makes it possible to significantly reduce or prevent electromagnetic coupling between the first transmission line and the second transmission line.

Figure 19:
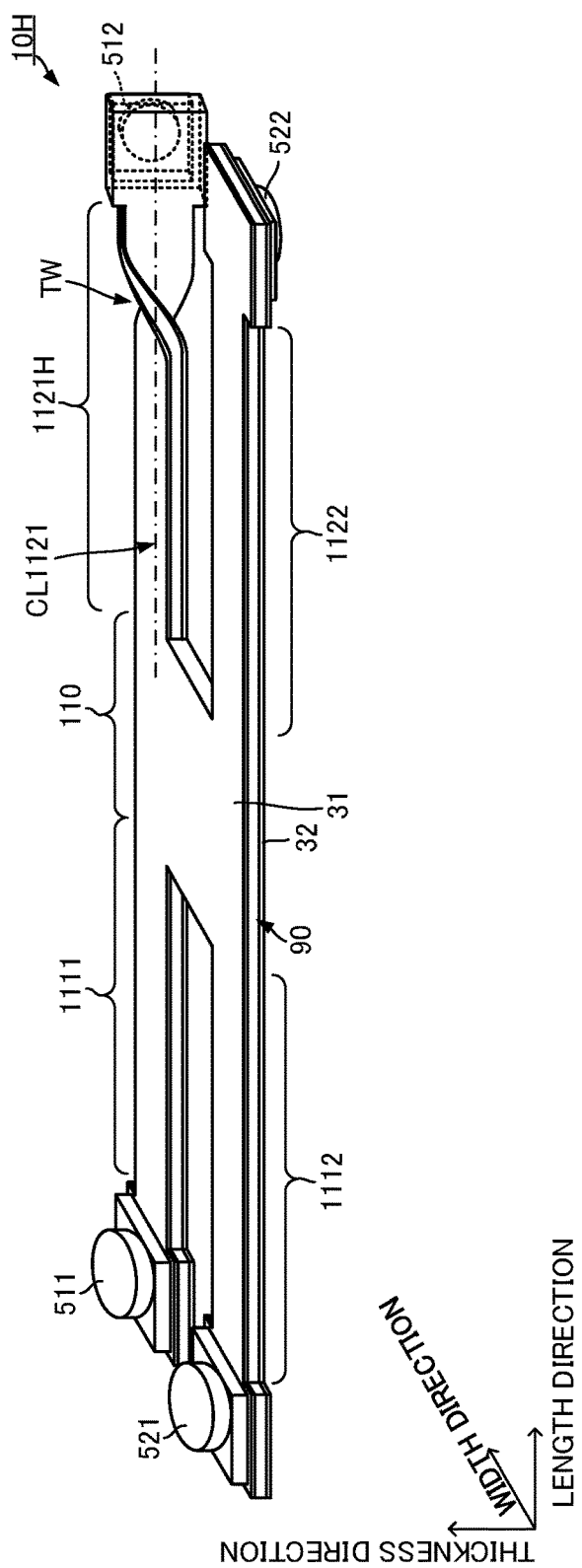
FIG. 19 is an external perspective view of a transmission line member having a twist according to a preferred embodiment of the present invention.

Furthermore, the transmission line member may include a twisted portion such as the one described below. FIG. 19 is an external perspective view of a transmission line member including a twist according to a preferred embodiment of the present invention.

A transmission line member 10H depicted in FIG. 19 differs from the transmission line member 10G depicted in FIG. 18 in that includes a twist TW in an extraction portion 1121H.

An extraction portion 1111 is a portion connecting a main portion 110 and a terminal portion on which an external connection terminal 511 is mounted. An extraction portion 1112 is a portion connecting the main portion 110 and a terminal portion on which an external connection terminal 521 is mounted. The extraction portion 1121H is a portion connecting the main portion 110 and a terminal portion on which an external connection terminal 512 is mounted. An extraction portion 1122 is a portion connecting the main portion 110 and a terminal portion on which an external connection terminal 522 is mounted.

The extraction portion 1121H includes the twist TW at an intermediate point along its extending direction. This twist causes a flat surface of the terminal portion on which the external connection terminal 512 is mounted to be perpendicular or substantially perpendicular to a flat surface of the main portion 110. Furthermore, the external connection terminal 512 faces a direction opposite to the external connection terminal 522 in the width direction of the transmission line member 10H at a stage before including the twist TW. In other words, in a state before including the twist TW in FIG. 19, the external connection terminal 512 is provided on a positive side surface (one of surfaces) in the thickness direction whereas the external connection terminal 522 is provided on a negative side surface (the other surface) in the thickness direction.

The twist TW is formed not by simply twisting an elongated flat plate, but is structurally constructed with strength large enough to keep this twisted state. In other words, this twisted state is being maintained without any external support.

In the present preferred embodiment, the meaning of that the extraction portion 1121H is twisted is a state where a flat surface of the extraction portion 1121H on the main portion 110 side in the length direction is perpendicular or substantially perpendicular to a flat surface on the external connection terminal 512 side while a center axis CL1121 being kept straight, which extends along the length direction of the extraction portion 1121H. However, even in a case that the flat surface of the extraction portion 1121H on the main portion 110 side is not perpendicular or substantially perpendicular to the flat surface on the external connection terminal 512 side, it may still be defined as the twist as long as these flat surfaces are not parallel to each other.

Such a structure allows the terminal portion including the external connection terminal 512 to move with ease in the width direction of the transmission line member 10H. This makes the transmission line member compatible with more diverse manners of installing.

Figure 20A:
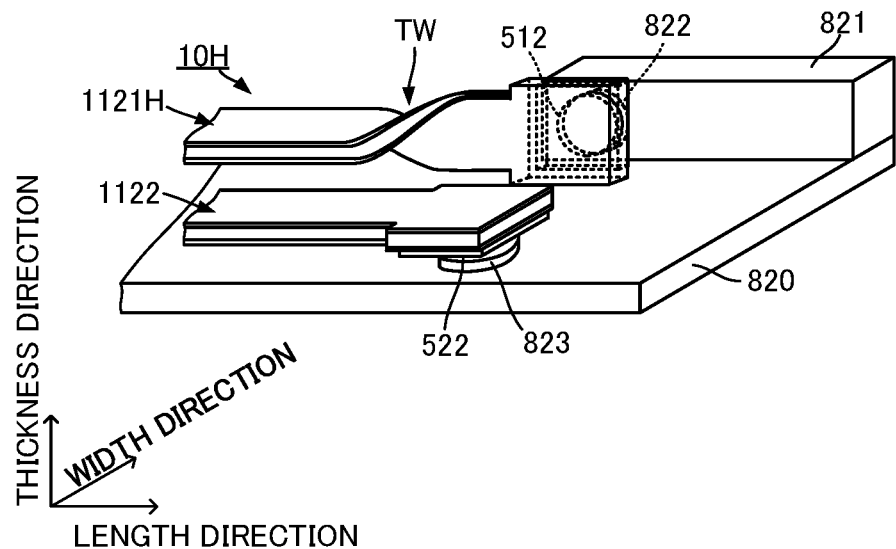
FIGS. 20A and 20B are a partial external perspective view and its plan view depicting a manner of installing the transmission line member depicted in FIG. 19.
Figure 20B:
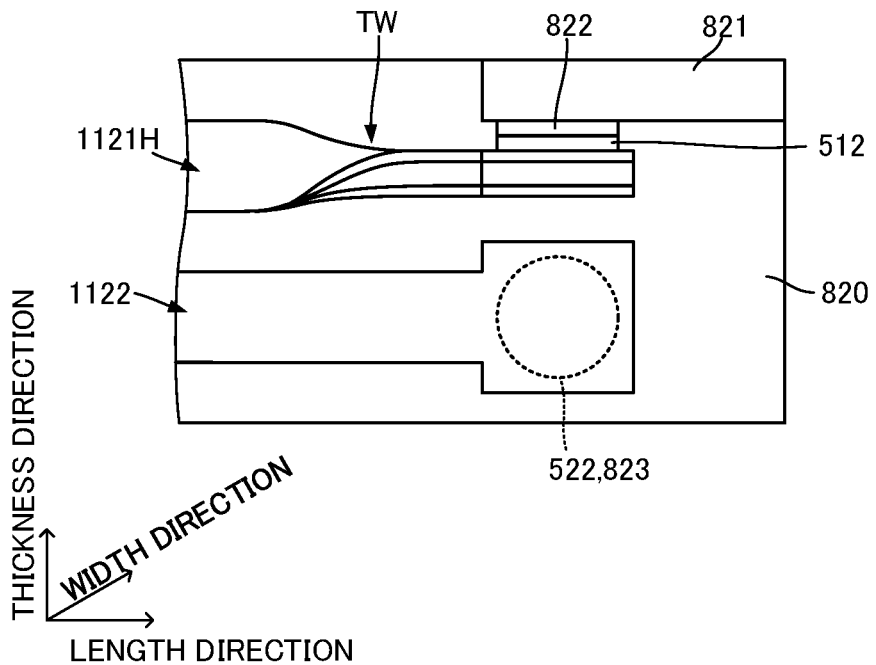

FIG. 20A is a partial external perspective view depicting a manner of installing the transmission line member depicted in FIG. 19, and FIG. 20B is its plan view.

As depicted in FIGS. 20A and 20B, a connection member 821 is mounted on a surface of a mount circuit board 820. On a side of the connection member 821, a connection terminal 822 is provided. Furthermore, a connection terminal 823 is provided on the surface of the mount circuit board 820. In this way, in the structure of FIGS. 20A and 20B, a connection plane of the connection terminal 822 and a connection plane of the connection terminal 823 are perpendicular or substantially perpendicular to each other.

The transmission line member 10H is mounted on the circuit board 820 and the connection member 821 by connecting the external connection terminal 512 to the connection terminal 822 and connecting the external connection terminal 522 to the connection terminal 823.

As described above, the transmission line member 10H is provided with the twist TW in the extraction portion 1121H. This enables the external connection terminal 512 of the extraction portion 1121H to connect with the connection terminal 822 with ease and without inflicting unnecessary stress even after the external connection terminal 522 of the extraction portion 1122 is connected to the connection terminal 823.

The twist TW such as above may be easily realized by subjecting thermoplastic dielectric layers to a twisting fabrication and cooling when forming a dielectric base body by performing thermocompression bonding of the thermoplastic dielectric layers as described above. Performing such a twisting fabrication stabilizes the shape of the twist TW and does not allow the twist TW to be untwisted easily.

Figure 21:
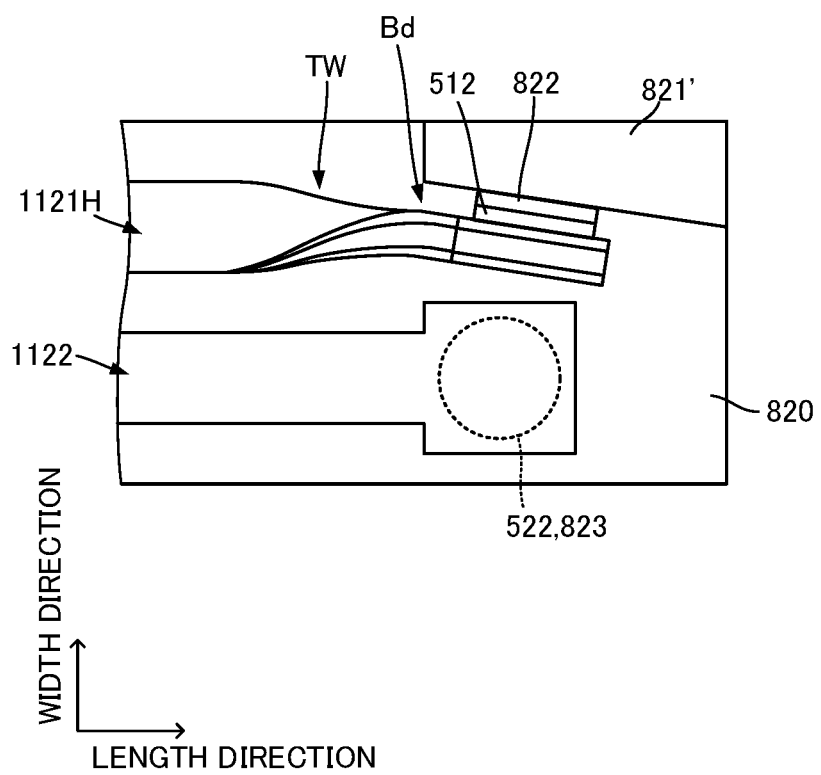
FIG. 21 is a partial plan view depicting another manner of installing the transmission line member depicted in FIG. 19.

Similarly, even in a structure depicted in FIG. 21, the transmission line member 10H is able to be attached to a mount circuit board 820. FIG. 21 is a partial plan view depicting another manner of installing the transmission line member depicted in FIG. 19.

As depicted in FIG. 21, a plane of a connection member 821', on which a connection terminal 822 is formed, is not parallel to the length direction of the transmission line member 10H.

Even with such a structure, the external connection terminal 512 may be connected to the connection terminal 822 with ease and without inflicting unnecessary stress by providing a bend Bd on the extraction portion 1121H at a point closer to the external connection terminal 512 side than the twist TW.

Although the transmission line member 10H depicted in FIG. 19 has a structure in which the extraction portion 1121H includes the twist TW, the transmission line member may alternatively have a twist depicted in FIG. 22. FIG. 22 is an external perspective view of another transmission line member having a twist according to a preferred embodiment of the present invention.

As depicted in FIG. 22, a transmission line member 10J includes a twist TW at a main portion 110J. The remaining configuration corresponds to that of the transmission line member 10G depicted in FIG. 18. The twist TW in the main portion 110J is defined as a state where surfaces on external connection terminals 511 and 521 sides are opposite to surfaces on external connection terminals 512 and 522 sides while a center axis CL110 being kept straight, which extends along the length direction of the main portion 110J.

Even in a case that the surfaces on external connection terminals 511 and 521 sides are not opposite to the surfaces on external connection terminals 512 and 522 sides, it may still be defined as the twist as long as these planes are not on the same side of the transmission line member 10K.

Such a structure enables the realization of the transmission line member 10J that is flexible in two directions (width direction and thickness direction) without increasing the size of the overall shape. Furthermore, this configuration makes it possible to switch positions of signal conductors in the width direction without using any interlayer connection conductor.

FIGS. 6A and 6B depict a manner of installing the transmission line member 10, in which the transmission line member 10 is curved along a component (battery pack 800) and connected to the mount circuit boards 82A and 82B. However, a manner of installing depicted in FIGS. 23A, 23B, 23C, 23D, and 23E may also be adopted.

Figure 23A:
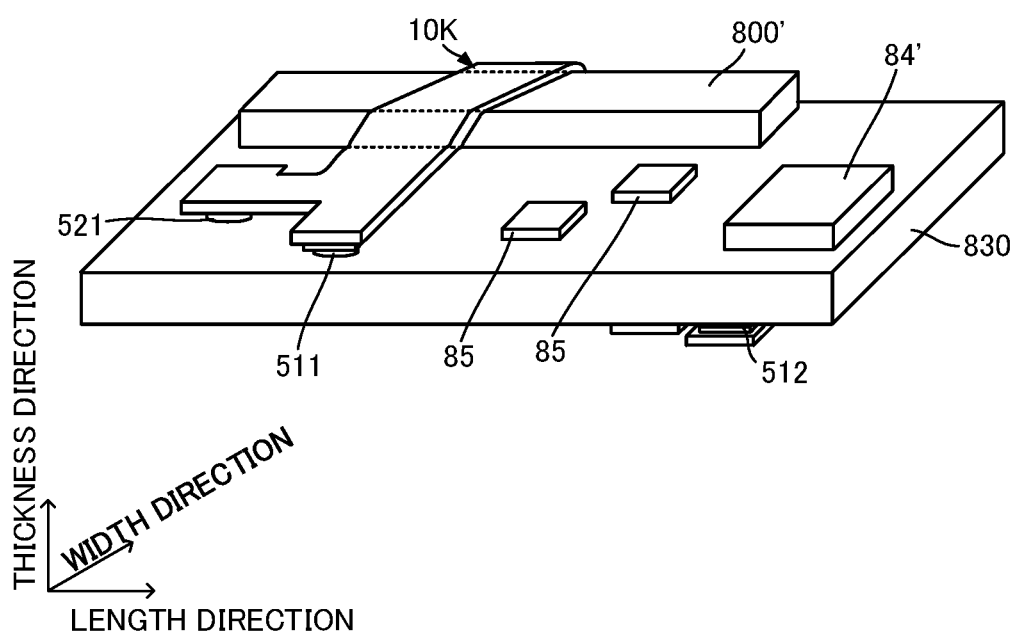
FIGS. 23A, 23C, 23D, and 23E are external perspective views depicting an exemplary manner of installing a transmission line member according to a preferred embodiment of the present invention.
Figure 23B:
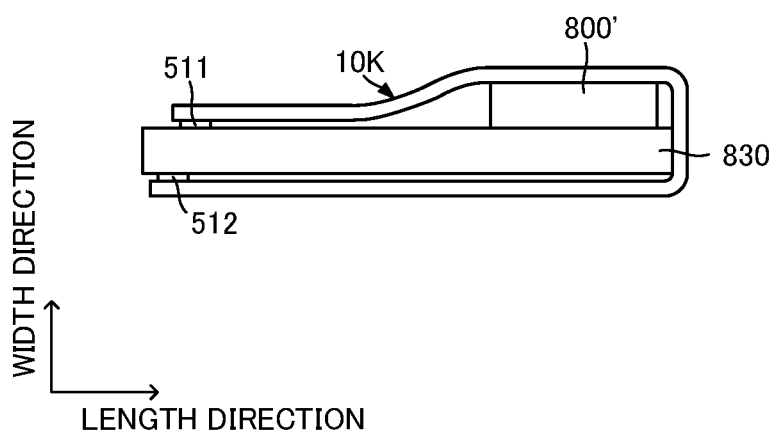
FIG. 23B is a side view of FIG. 23A.
Figure 23C:
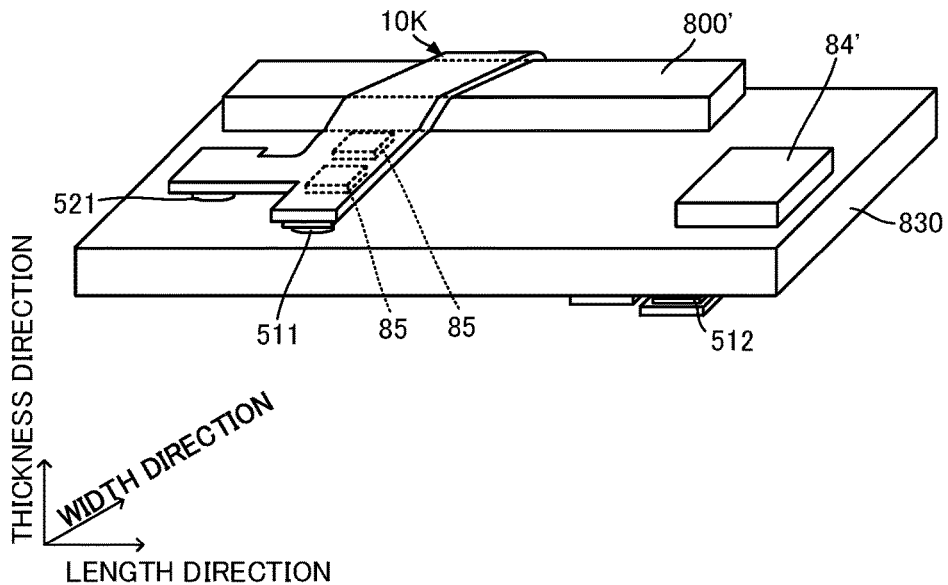
Figure 23D:
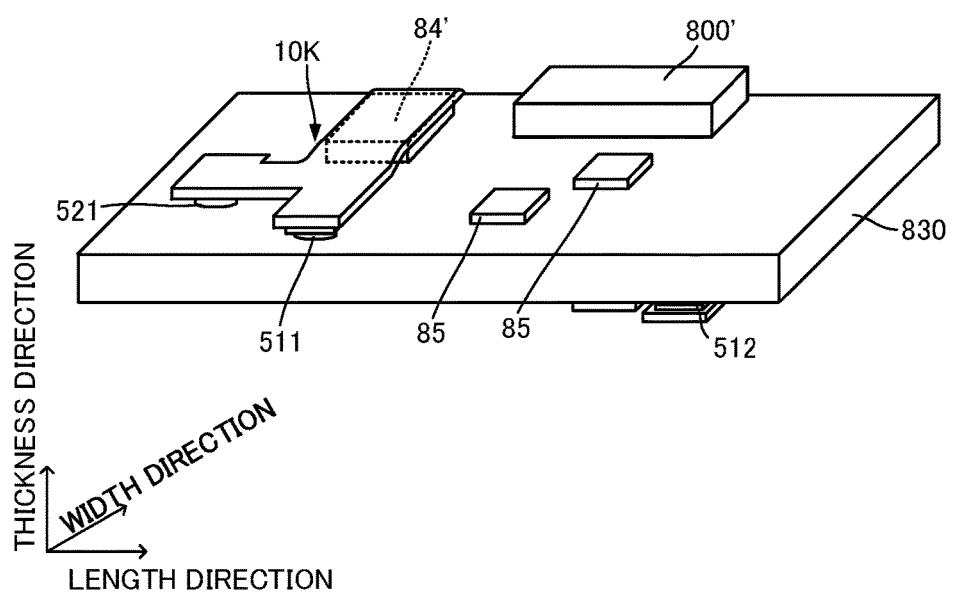
Figure 23E:
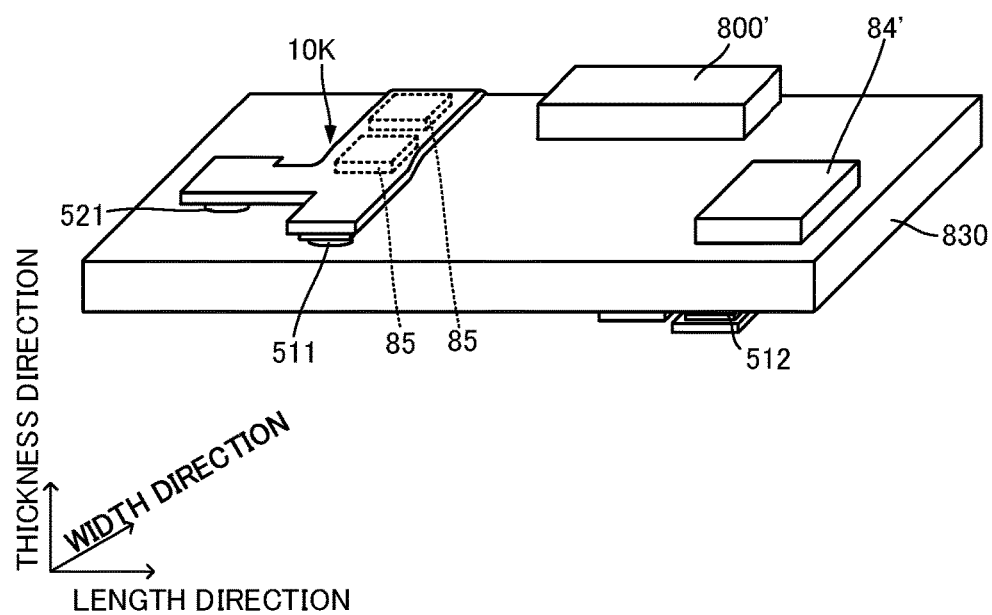

FIG. 23A is an external perspective view depicting an exemplary manner of installing a transmission line member according to a preferred embodiment of the present invention, and FIG. 23B is its side view. Also, FIGS. 23C, 23D, and 23E are external perspective views depicting an exemplary manner of installing a transmission line member according to a preferred embodiment of the present invention.

As depicted in FIGS. 23A and 23B, a mount circuit board 830 is wrapped by a transmission line member 10K in such a way that the transmission line member 10K covers the mount circuit board 830 from a top surface to a back surface via its side. As depicted in FIGS. 23A and 23B, on the top surface of the mount circuit board 830, a battery pack 800' is mounted, and the mount circuit board 830 including the battery pack 800' is wrapped by the transmission line member 10K. As depicted in FIG. 23C, on the top surface of the mount circuit board 830, a battery pack 800' and mount components 85 are mounted, and the mount circuit board 830 including the battery pack 800' and mount components 85 are wrapped by the transmission line member 10K. As depicted in FIG. 23D, on the top surface of the mount circuit board 830, an IC chip 84' is mounted, and the mount circuit board 830 including IC chip 84' are wrapped by the transmission line member 10K. Also, as depicted in FIG. 23E, on the top surface of the mount circuit board 830, mount components 85 are mounted, and the mount circuit board 830 including mount components 85 are wrapped by the transmission line member 10K. It is to be noted that the present invention is not limited to the configurations shown in FIGS. 23A, 23B, 23C, 23D, and 23E.

External connection terminals 511 and 521 of the transmission line member 10K are connected to connection terminals on the top surface of the mount circuit board 830. External connection terminals 512 and 522 are connected to connection terminals on the back surface of the mount circuit board 830.

As described above, adopting the structure in which the mount circuit board 830 is wrapped by the transmission line member 10K causes a magnetic field produced by the transmission line member 10K at a portion on the top surface side of the mount circuit board 830 to be in an opposite direction to a magnetic field produced by the transmission line member 10K at a part on the back surface side of the mount circuit board 830. Thus, these magnetic fields are offset against each other. Accordingly, unwanted outgoing emissions of high frequency signals traveling along the transmission line member 10K and its harmonics may be significantly reduced or prevented.

Figure 24:
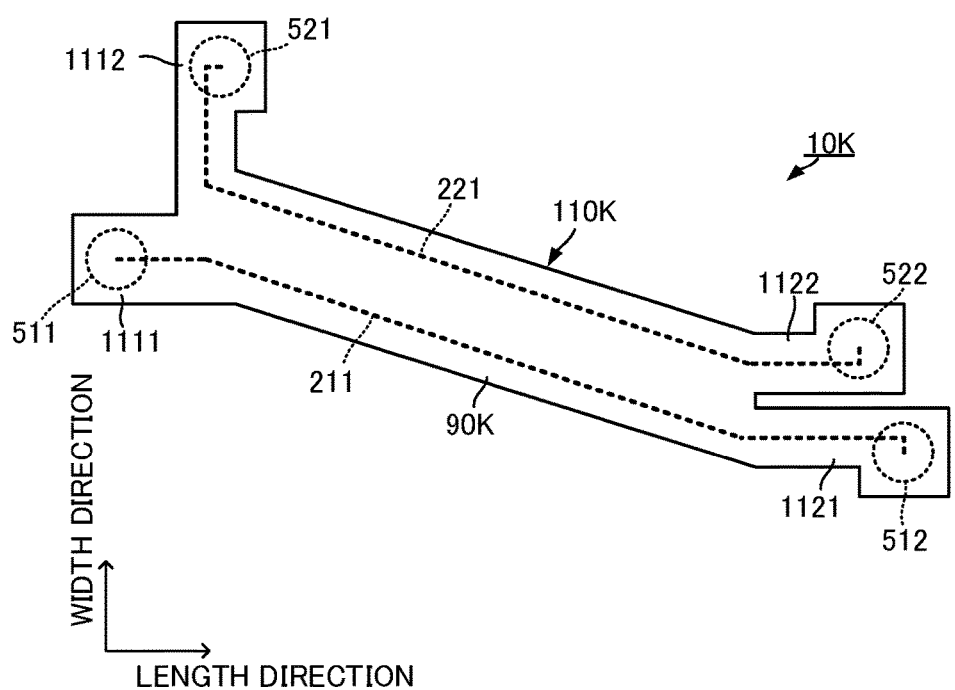
FIG. 24 is a plan view depicting a schematic structure of a transmission line member that realizes the configuration of FIGS. 23A and 23B.

As depicted in FIGS. 23A, 23B, 23C, 23D, and 23E, connection points of the external connection terminals 511 and 521 and connection points of the external connection terminals 512 and 522 are greatly differ from each other in the length direction of the mount circuit board 830. In such a case, the transmission line member 10K may have a structure depicted in FIG. 24. FIG. 24 is a plan view depicting a schematic structure of a transmission line member that achieves the configuration of FIGS. 23A and 23B. In FIG. 24, the first transmission line 21 and the second transmission line 22 are depicted as line patterns, and the configurations such as specific coil conductor patterns that define other filter devices are omitted from the drawing. As depicted in FIG. 24, a main portion 110K of a dielectric base body 90K in the transmission line member 10K has a shape that extends in a direction that is not perpendicular or substantially perpendicular or parallel to the length direction and the width direction. Such a structure makes it possible to facilitate the installation of the transmission line member 10K on the mount circuit board 830 even in a case that the location of a connection terminal on the top surface side is separated from that of a connection terminal on the back surface side.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic apparatus comprising:
a transmission line member; and
a mount circuit board; wherein
the transmission line member includes:

a dielectric base body;
a first signal conductor that is disposed inside the dielectric base body, and has an elongated shape extending along a transmission direction of high frequency signals;
a first ground conductor disposed at one side of the first signal conductor in a thickness direction of the dielectric base body; and
a second ground conductor disposed at another side of the first signal conductor in the thickness direction of the dielectric base body;
a first transmission line that transmits a first high frequency signal is defined by the first signal conductor interposed between the first ground conductor and the second ground conductor;
the mount circuit board is wrapped by the transmission line member such that the transmission line member covers the mount circuit board from a top surface of the mount circuit board to a back surface of the mount circuit board via a side surface of the mount circuit board; and
at least one of an IC chip, a mount component, and a battery pack is mounted on the mount circuit board and is wrapped by the transmission line member so as to be disposed on an inner peripheral side of the transmission line member.

2. The electronic apparatus according to claim 1, further comprising:
a plurality of interlayer connection conductors that connect the first ground conductor and the second ground conductor and extend in the thickness direction.

3. An electronic apparatus comprising:
a transmission line member; and
a mount circuit board; wherein
the transmission line member includes:
a dielectric base body;
a first signal conductor and a second signal conductor that are disposed inside the dielectric base body, have an elongated shape extending along a transmission direction of high frequency signals, and are disposed adjacent to each other;
a plurality of ground conductors that are interposed between the first conductor and the second conductor in a thickness direction of the dielectric base body;
a first transmission line which includes the first signal conductor and the ground conductors;
a second transmission line which includes the second signal conductor and the ground conductors;
a main portion; and
a plurality of extraction portions that are connected to both end portions of the main portion and have a structure such that the first transmission line and the second transmission line are separated from each other;
the first transmission line transmits the high frequency signals by interposing the first signal conductor between the ground conductors;
the second transmission line transmits the high frequency signals by interposing the second signal conductor between the ground conductors;
the mount circuit board is wrapped by the transmission line member in such a way that the transmission line member covers the mount circuit board from a top surface to a back surface via a side of the mount circuit board; and
the main portion faces the side of the mount circuit board.

* * * * *